(12) United States Patent
Lin et al.

(10) Patent No.: US 12,199,158 B2
(45) Date of Patent: *Jan. 14, 2025

(54) NON-CONFORMAL OXIDE LINER AND MANUFACTURING METHODS THEREOF

(71) Applicant: Taiwan Semiconductor Manufacturing Co., Ltd., Hsinchu (TW)

(72) Inventors: Ming-Ho Lin, Taipei (TW); Chun-Heng Chen, Hsinchu (TW); Xiong-Fei Yu, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/178,644

(22) Filed: Mar. 6, 2023

(65) Prior Publication Data

US 2023/0207646 A1    Jun. 29, 2023

Related U.S. Application Data

(63) Continuation of application No. 17/026,976, filed on Sep. 21, 2020, now Pat. No. 11,640,977, which is a (Continued)

(51) Int. Cl.
*H01L 21/76* (2006.01)
*H01L 21/8234* (2006.01)
(Continued)

(52) U.S. Cl.
CPC ............ *H01L 29/41791* (2013.01); *H01L 21/823431* (2013.01); *H01L 29/66795* (2013.01); *H01L 29/785* (2013.01)

(58) Field of Classification Search
CPC ....... H01L 29/41791; H01L 21/823431; H01L 29/66795; H01L 29/785; H01L 29/7856;
(Continued)

(56) References Cited

U.S. PATENT DOCUMENTS

| 6,713,335 B2 | 3/2004 | Yen et al. | |
| 7,745,871 B2 * | 6/2010 | Oh | H01L 29/66545 |
| | | | 257/E29.264 |

(Continued)

FOREIGN PATENT DOCUMENTS

| KR | 100657824 B1 | 12/2006 |
| KR | 20100048690 A | 5/2010 |

(Continued)

*Primary Examiner* — Tan N Tran
(74) *Attorney, Agent, or Firm* — Slater Matsil, LLP

(57) ABSTRACT

A method includes forming a fin protruding over a substrate; forming a conformal oxide layer over an upper surface and along sidewalls of the fin; performing an anisotropic oxide deposition or an anisotropic plasma treatment to form a non-conformal oxide layer over the upper surface and along (Continued)

the sidewalls of the fin; and forming a gate electrode over the fin, the conformal oxide layer and the non-conformal oxide layer being between the fin and the gate electrode.

20 Claims, 29 Drawing Sheets

Related U.S. Application Data continuation of application No. 15/984,033, filed on May 18, 2018, now Pat. No. 10,784,359.

(51) Int. Cl.
*H01L 29/417* (2006.01)
*H01L 29/66* (2006.01)
*H01L 29/78* (2006.01)

(58) Field of Classification Search
CPC ......... H01L 29/66787; H01L 21/28158; H01L 29/42364; H01L 29/7853; H01L 21/02274; H01L 21/0228; H01L 21/02554; H01L 21/76243
USPC ....................................................... 257/365
See application file for complete search history.

(56) References Cited

U.S. PATENT DOCUMENTS

| | | | |
|---|---|---|---|
| 9,153,696 B2 * | 10/2015 | An | ...................... H01L 27/1211 |
| 9,780,217 B2 | 10/2017 | Yeh et al. | |
| 10,347,745 B2 * | 7/2019 | Suvarna | ............ H01L 29/66666 |
| 10,541,143 B2 * | 1/2020 | Guler | ................ H01L 29/66545 |
| 10,784,359 B2 * | 9/2020 | Lin | ...................... H01L 29/7856 |
| 11,640,977 B2 * | 5/2023 | Lin | ....................... H01L 29/785 |
| | | | 257/365 |
| 2008/0029828 A1 | 2/2008 | Oh et al. | |
| 2010/0022099 A1 | 1/2010 | VanNooten et al. | |
| 2010/0109057 A1 | 5/2010 | Kang et al. | |
| 2015/0115371 A1 | 4/2015 | Ganz et al. | |
| 2016/0013308 A1 | 1/2016 | Lee et al. | |
| 2018/0005876 A1 | 1/2018 | Tung et al. | |

FOREIGN PATENT DOCUMENTS

| | | |
|---|---|---|
| TW | 201637216 A | 10/2016 |
| TW | 201801278 A | 1/2018 |

\* cited by examiner

US 12,199,158 B2

NON-CONFORMAL OXIDE LINER AND MANUFACTURING METHODS THEREOF

PRIORITY CLAIM AND CROSS-REFERENCE

This application is a continuation of U.S. patent application Ser. No. 17/026,976, filed on Sep. 21, 2020, entitled "Non-Conformal Oxide Liner and Manufacturing Methods Thereof," which is a continuation of U.S. patent application Ser. No. 15/984,033, filed on May 18, 2018, and entitled "Non-Conformal Oxide Liner and Manufacturing Methods thereof," now U.S. Pat. No. 10,784,359, issued Sep. 22, 2020, which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming a non-conformal dielectric layer, e.g., an oxide layer (may also be referred to as an oxide liner) over a top surface and along sidewalls of a fin of a FinFET device. In particular, the non-conformal oxide layer is thicker over the top surface of the fin than along the sidewalls of the fin. The thicker top portion (e.g., the portion over the top surface of the fin) of the non-conformal oxide layer protects the fin from being damaged during a subsequent etching process, while the thinner sidewall portions (e.g., portions along the sidewalls of the fin) of the non-conformal oxide layer allow for higher integration density of FinFETs and easier gap fill between adjacent fins. While the various embodiments are described in the context of an oxide layer on FinFET devices, the principle of the invention may be used for other applications or devices, such as planar devices, and other materials.

Figure 1:
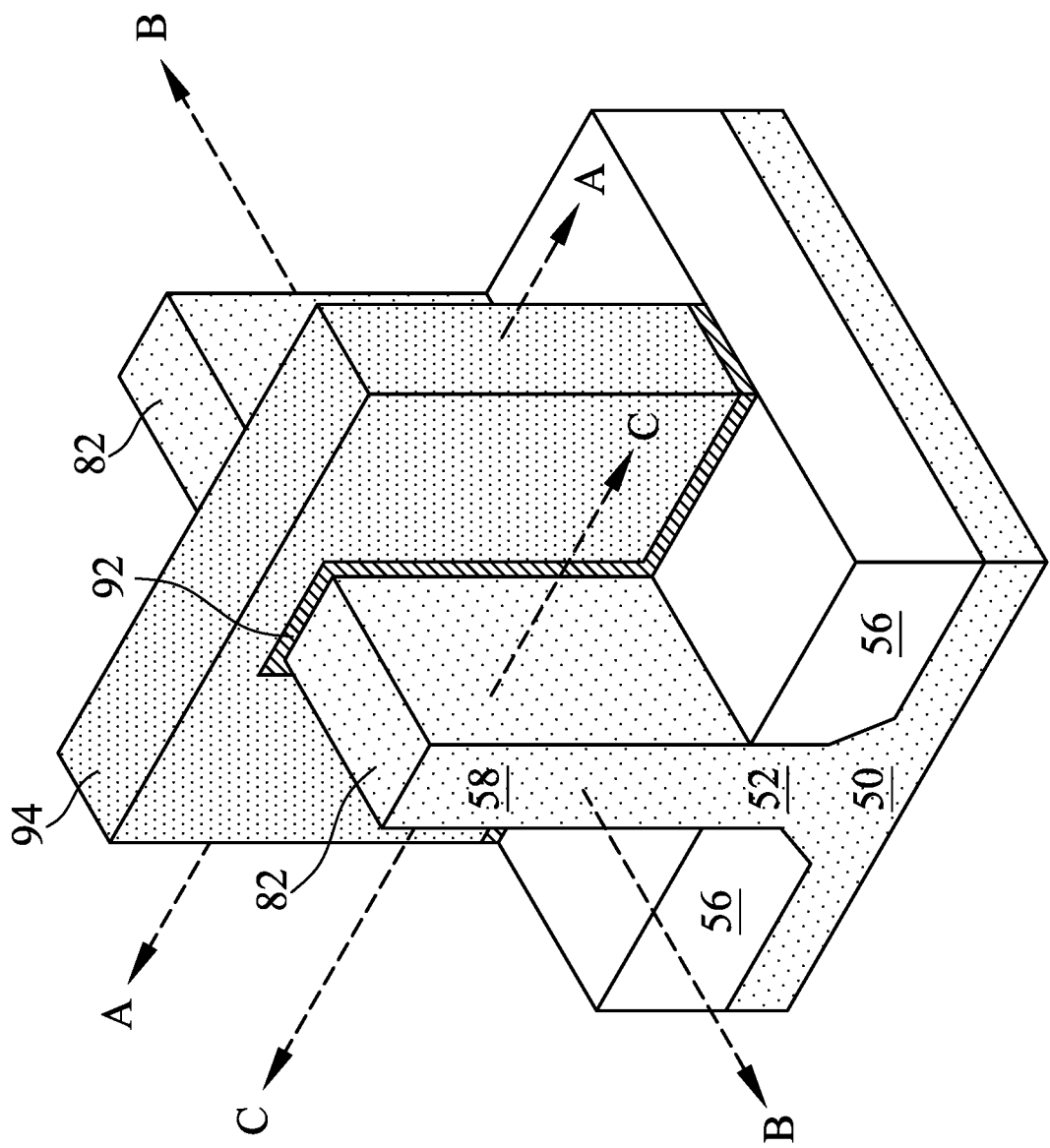
FIG. 1 illustrates an example of a fin field-effect transistor (FinFET) in a three-dimensional view, in accordance with some embodiments.

FIG. 1 illustrates an example of a FinFET in a three-dimensional view, in accordance with some embodiments. The FinFET comprises a fin 58 over a substrate 50 (e.g., a semiconductor substrate). Isolation regions 56 are disposed over the substrate 50 and on opposing sides of the fin 58. The fin 58 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. A gate dielectric layer 92 is along sidewalls and over a top surface of the fin 58, and a gate electrode 94 is over the gate dielectric layer 92. Source/drain regions 82 are disposed on opposite sides of the fin 58 with respect to the gate dielectric layer 92 and gate electrode 94. FIG. 1 further illustrates reference cross-sections that are used in later figures. Cross-section A-A is along a longitudinal axis of the gate electrode 94 and in a direction, e.g., perpendicular to the direction of a current flow between the source/drain regions 82 of the FinFET. Cross-section B-B is perpendicular to cross-section A-A and is along a longitudinal axis of the fin 58 and in a direction of, e.g., the current flow between the source/drain regions 82 of the FinFET. Cross-section C-C is parallel to cross-section A-A and extends through a source/drain region 82 of the FinFET. Subsequent figures refer to these reference cross-sections for clarity.

FIGS. 2-6, 7A, and 16A-24B are cross-sectional views of a FinFET device at various stages of manufacturing, in accordance with an embodiment. FIGS. 2 through 7 illustrate reference cross-section A-A illustrated in FIG. 1, except for multiple fins/FinFETs. In FIGS. 16A through 24B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. FIGS. 18C and 18D are illustrated along reference cross-section C-C illustrated in FIG. 1, except for multiple fins/FinFETs.

Figure 2:
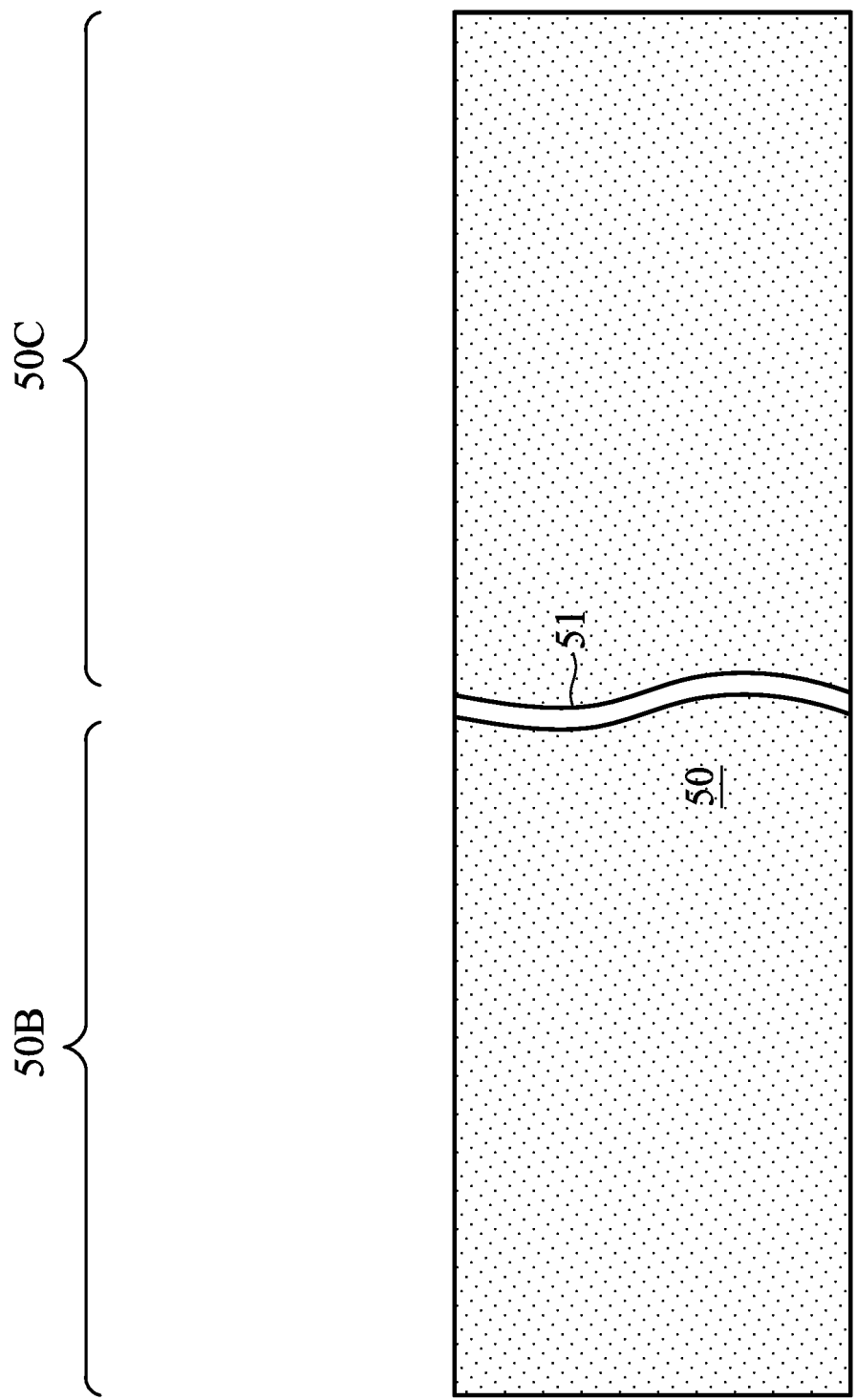
FIGS. 2, 3, 4, 5, 6, 7A are cross-sectional views of a FinFET device at various stages of the manufacturing, in accordance with an embodiment.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by divider 51), and any number of device features (e.g., other active devices, doped regions, isolation structures, etc.) may be disposed between the region 50B and the region 50C. In some embodiments, both the region 50B and the region 50C are used to form the same type of devices, such as both regions being for n-type devices or p-type devices.

Figure 3:
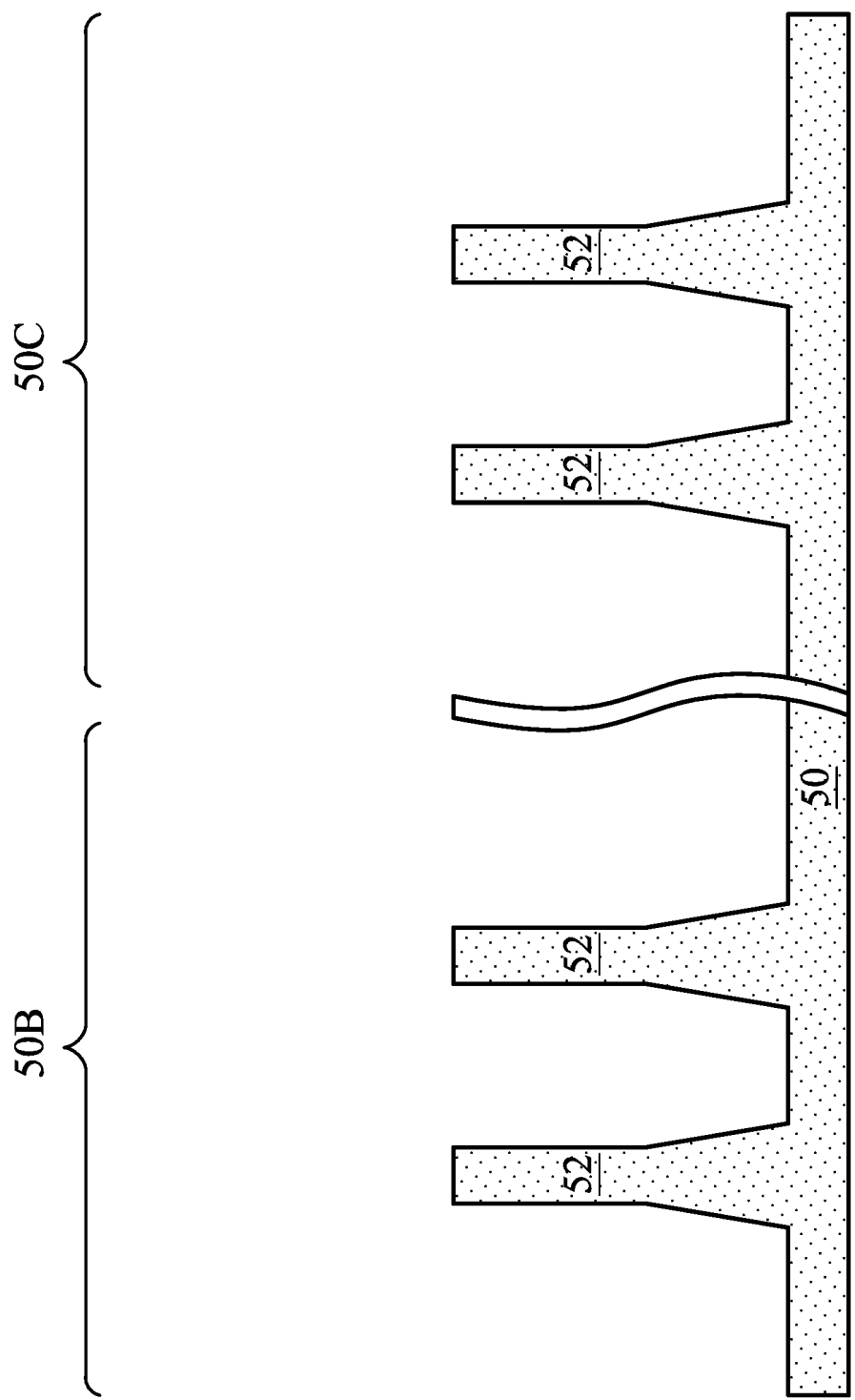

Next, in FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etching may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
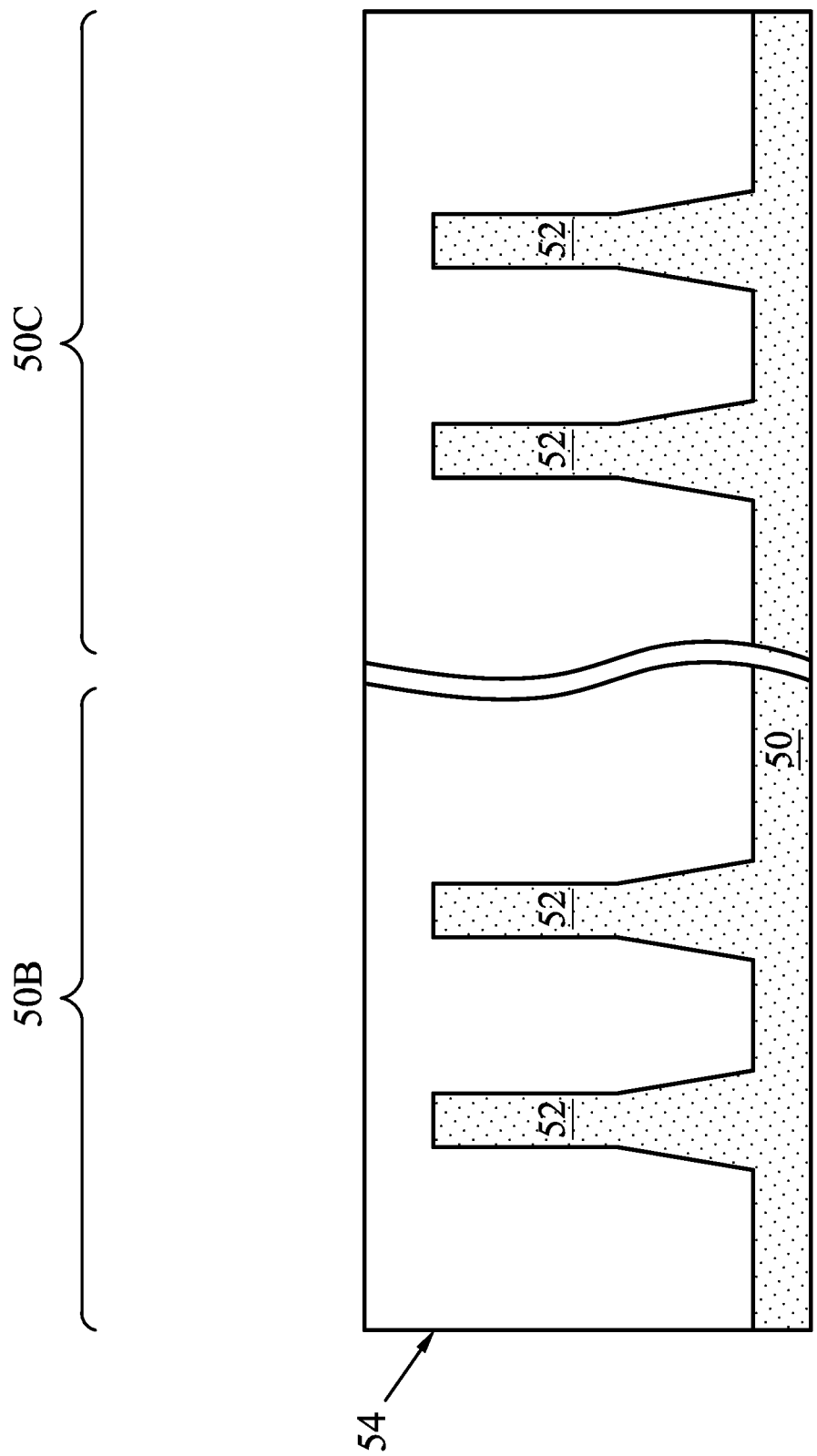

Next, in FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 5:
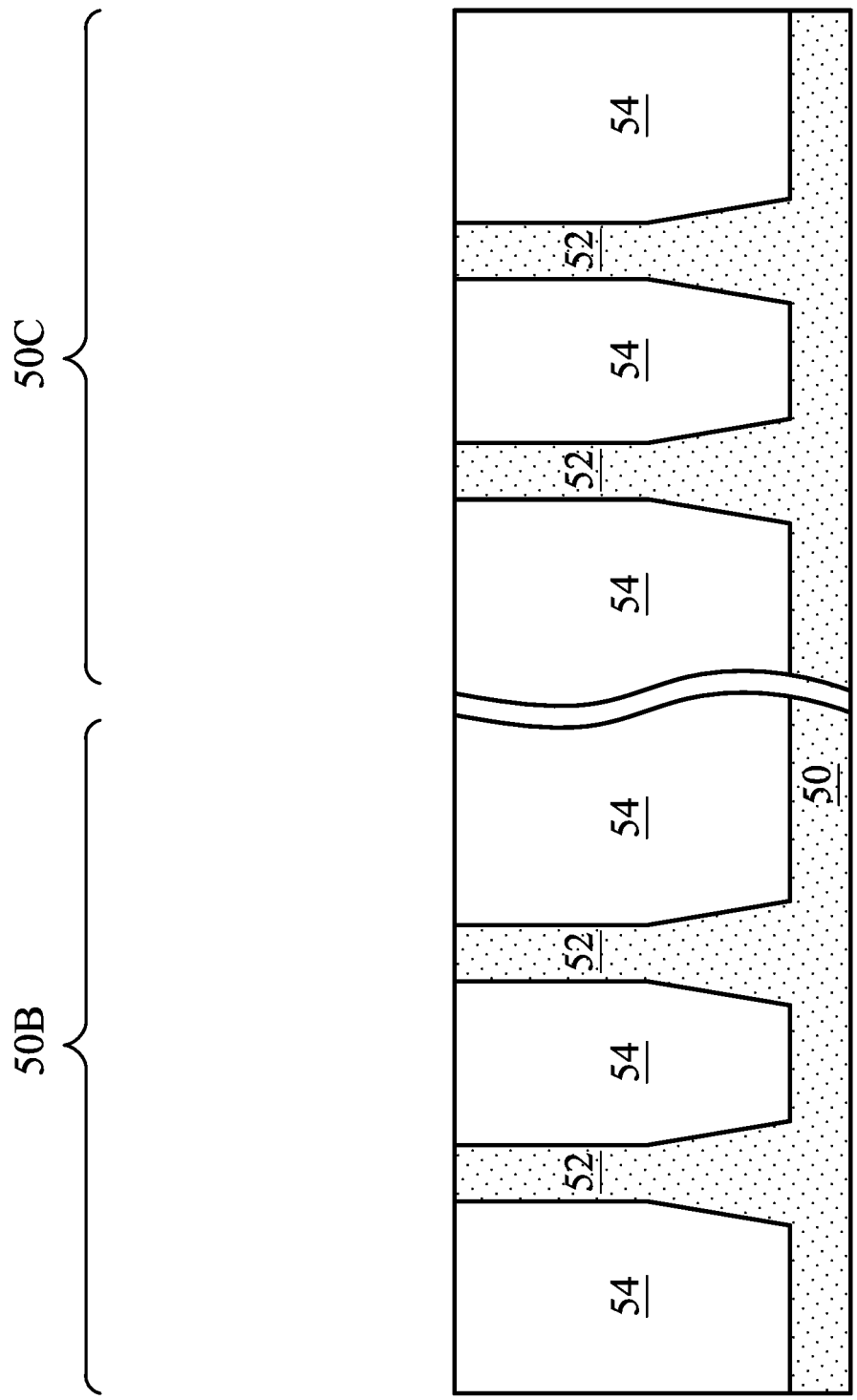

Referring next to FIG. 5, a planarization process is applied to the insulation material 54. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process is complete.

Figure 6:
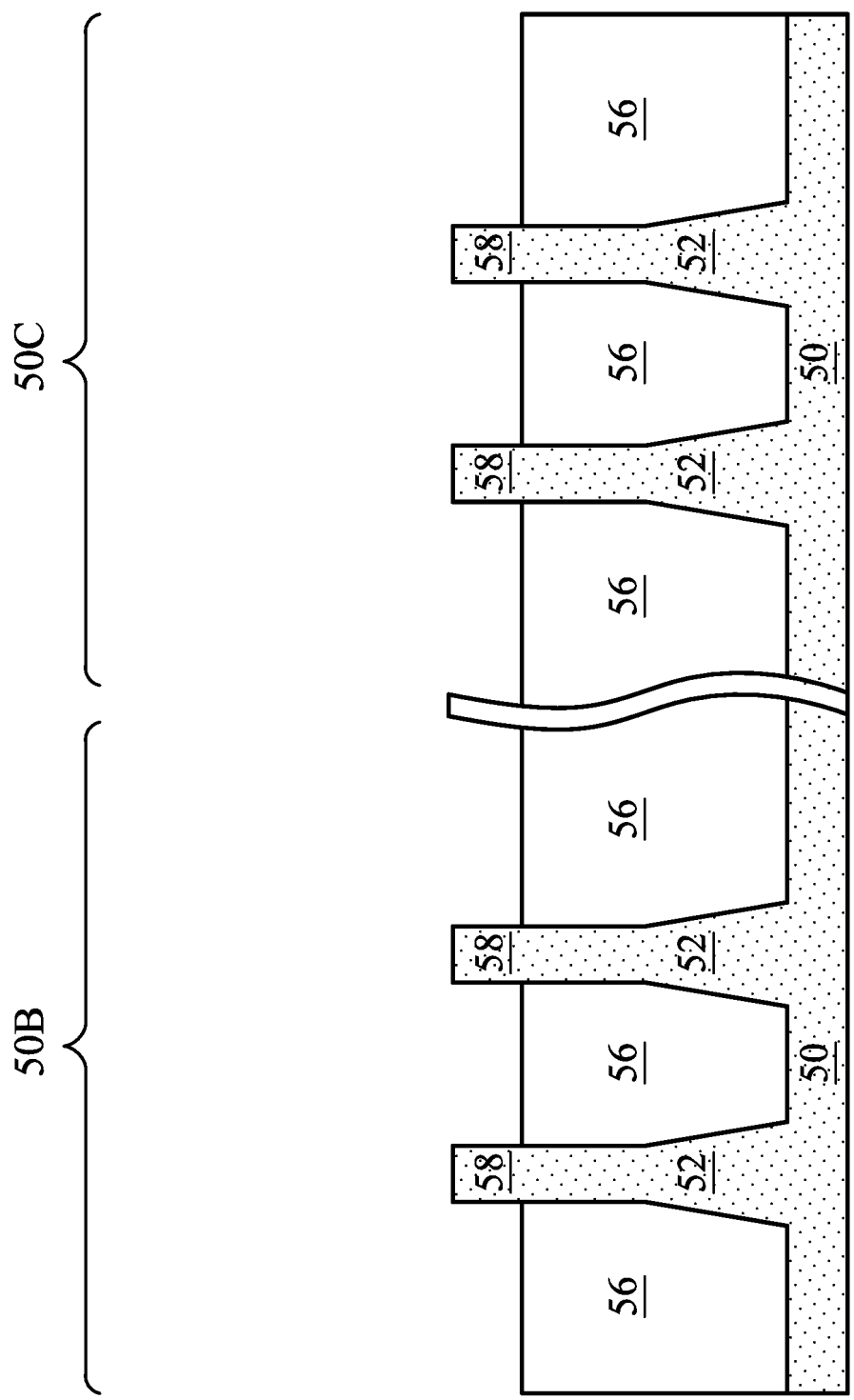

Next, in FIG. 6, the insulation material 54 is recessed to form Shallow Trench Isolation (STI) regions 56. The insulation material 54 is recessed such that fins 58 (e.g., portions of the fins 52 protruding above the upper surface of the STI region 56) in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 5 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 58, the fins 52, and/or the substrate 50. In some embodiments, a P well may be formed in the region 50B, and an N well may be formed in the region 50C. In some embodiments, a P well or an N well are formed in both the region 50B and the region 50C.

In the embodiments with different well types, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, $BF_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50B and the region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7A:
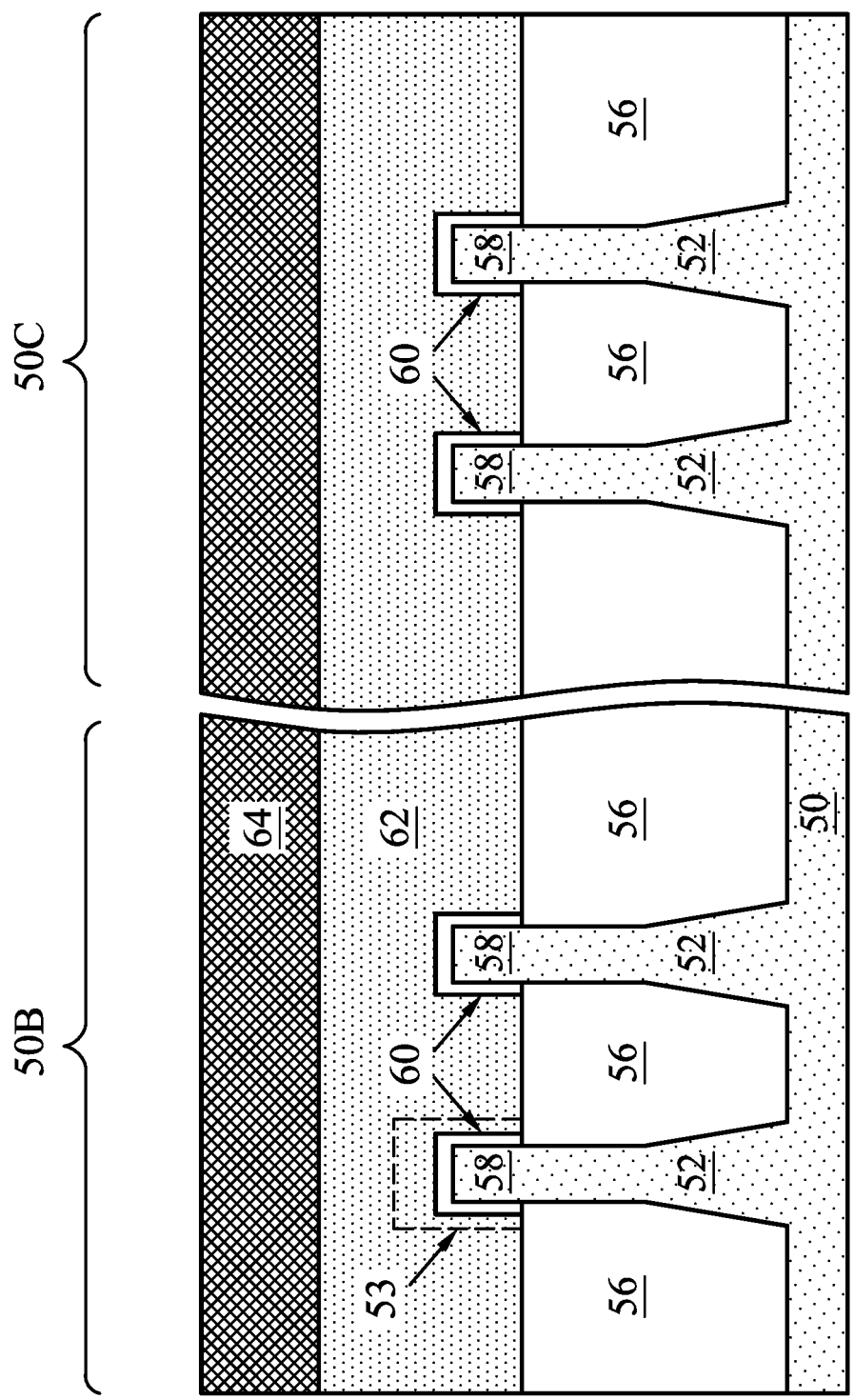
Figure 7B:
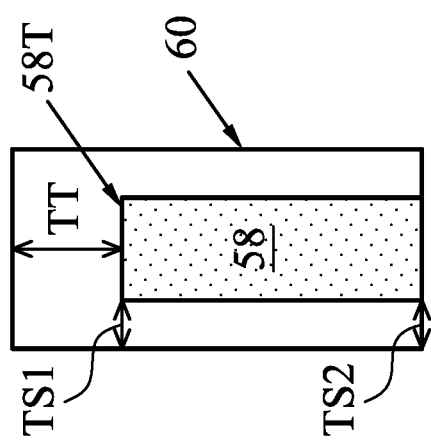
FIG. 7B is a zoomed-in view of a portion of FIG. 7A.

Referring next to FIG. 7A, a dummy dielectric layer 60 is formed on the fins 58, e.g., over the top surfaces and sidewalls of the fins 58. Although not illustrated in FIG. 7A (and subsequent figures), the dummy dielectric layer 60 may also be formed over the STI regions 56. For example, the dummy dielectric layer 60 may extend continuously along the upper surface of the STI regions 56 from a fin 58 to an adjacent fin 58. The dummy dielectric layer 60 may be an oxide, such as silicon oxide, germanium oxide, or the like, although other suitable material, such as silicon nitride, may also be used. In the illustrated embodiment, the dummy dielectric layer 60 comprises an oxide of the material of the fin 58. For example, if the fin 58 is formed of silicon, the dummy dielectric layer 60 is formed of silicon oxide. As illustrated in FIG. 7A, the dummy dielectric layer 60 is a non-conformal layer. More details of the dummy dielectric layer 60 are shown in FIG. 7B, which is a zoomed-in view of an area 53 in FIG. 7A. Note that for clarity, not all features inside the area 53 are illustrated in FIG. 7B. Various embodiment methods for forming the non-conformal dummy dielectric layer 60 are discussed hereinafter with reference to FIGS. 8, 9A, 9B, 10, 11, 12A, 12B, 13, 14A, 14B, 15A and 15B.

Referring to FIG. 7B, portions of the dummy dielectric layer 60 disposed over a top surface of the fin 58 (referred to as the top portion of the dummy dielectric layer 60) is thicker than portions of the dummy dielectric layer 60 disposed along sidewalls of the fin 58 (referred to as sidewall portions of the dummy dielectric layer 60). In particular, the dummy dielectric layer 60 is substantially uniform over the top surface of the fin 58 and has a thickness TT, in the illustrated example. The thickness TT may be in a range between, e.g., about 2 nm and about 10 nm, although other dimensions are also possible. The dummy dielectric layer 60 disposed along the sidewalls of the fin 58 has an average thickness (e.g., measured along a direction perpendicular to the sidewalls of the fin 58, not illustrated in FIG. 7B) that is smaller than the thickness TT. In some embodiments, the average thickness is less than about 80% of the thickness TT. The average thickness may be in a range between, e.g., 2 nm and about 5 nm, although other dimensions are also possible.

During the formation of the dummy dielectric layer 60, less oxide (e.g., silicon oxide) may be formed at the bottom of the fin 58 than at the top of the fin 58, e.g., due to the narrow space between adjacent fins 58. As a result, a thickness of the dummy dielectric layer 60 along the sidewalls of the fin 58 may decrease slightly along a direction from the top of the fin 58 toward the bottom of the fin 58. In some embodiments, the dummy dielectric layer 60 along the sidewalls of the fin 58 has a thickness TS1 at the top surface 58T of the fin 58, and a thickness TS2 at the bottom of the fin 58, where TS2 is larger than about 90% of TS1. As will be discussed in details hereinafter, the dummy dielectric layer 60 may be formed by a single anisotropic deposition process (see FIGS. 8A, 8B, and the discussions thereof), or may be formed by two different processes (see FIGS. 9A-15B and the discussions thereof).

Referring back to FIG. 7A, after the dummy dielectric layer 60 is formed, a dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In the illustrated example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

Figure 8A:
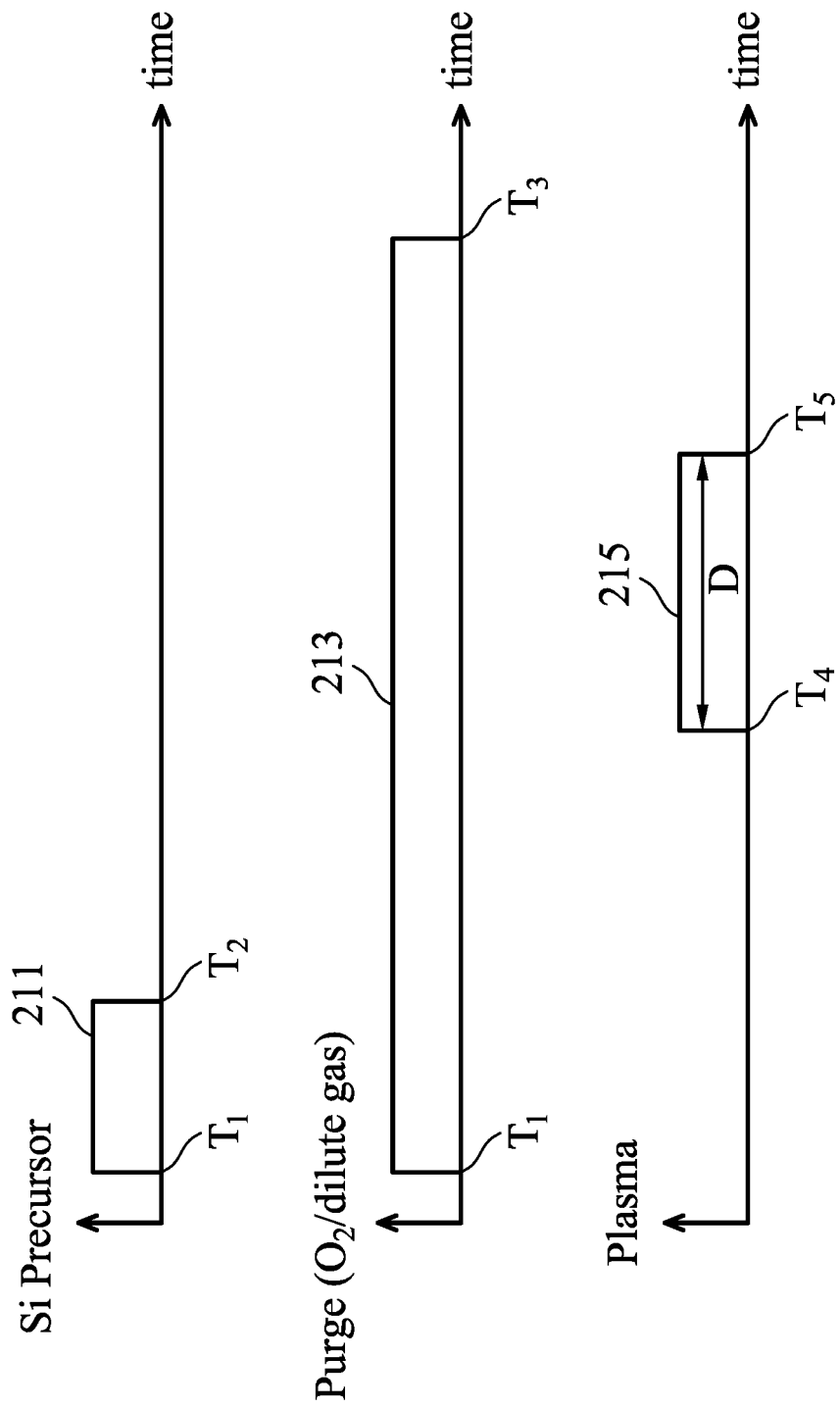
FIG. 8A illustrates a timing diagram of a method for forming a non-conformal oxide layer, in accordance with an embodiment.

FIG. 8A illustrates a timing diagram of a plasma-enhanced ALD (PEALD) process for forming a non-conformal oxide layer (e.g., the dummy dielectric layer 60 of FIG. 7B), in accordance with an embodiment. The timing diagram of FIG. 8A corresponds to a cycle of the PEALD plasma process, where the PEALD process includes a plurality of cycles. In other words, the processing of FIG. 8A is performed multiple times (cycles) during the PEALD process. Although PEALD is often used to form conformal layers, the presently disclosed methods, by controlling the deposition process parameters, are able to form non-conformal layers (e.g., the dummy dielectric layer 60 of FIG. 7B) with a specified shape, such as the shape illustrated in FIG. 7B. Therefore, the PEALD process illustrated by FIG. 8A may also be referred to as an anisotropic PEALD process or an anisotropic deposition process. In some embodiments, the anisotropic PEALD process illustrated by FIG. 8A is performed to form the dummy dielectric layer 60 of FIG. 7B.

FIG. 8A includes three subplots, and the time (along X-axis) of all the subplots is aligned. The curve 211 shows the time when a precursor for the PEALD process is supplied to a deposition chamber, where the FinFET device of FIG. 6 is placed in the deposition chamber for forming the dummy dielectric layer 60. The type of precursor may depend on the oxide layer to be formed. For example, to form a silicon oxide layer as the dummy dielectric layer 60, the precursor is a silicon precursor such as amino silane gas. Examples of amino silane gas include bisdiethylaminosilane (BDEAS) and diisopropylaminosilane (DIPAS). Similarly, to form a germanium oxide layer as the dummy dielectric layer 60, the precursor may be a germanium precursor.

As illustrated in FIG. 8A, starting at time $T_1$, the precursor (e.g., a silicon precursor) is supplied to the deposition chamber; and at time $T_2$, the precursor is stopped. A duration between time $T_1$ and time $T_2$ may be between about 0.1 seconds and 10 seconds, and a flow rate of the precursor may be between about 1000 standard cubic centimeters per minute (sccm) and about 5000 sccm. At time $T_1$, a gas source comprising an oxygen gas and a carrier gas (may also be referred to as a dilute gas) is also supplied to the deposition chamber, as illustrated by the curve 213. The carrier gas may be or comprise, but is not limited to, an inert gas such as Ar, He, Kr, or the like. The gas source is supplied to the deposition chamber until time $T_3$, at which time the gas source is stopped. A duration between time $T_1$ and time $T_3$ may be between about 1 second and 300 seconds. In the illustrate example, a flow rate of the oxygen gas is between about 50 sccm and about 5000 sccm, and a ratio between the flow rate of the oxygen gas and a sum of the flow rate of oxygen gas and a flow rate of the carrier gas is between about 1% and about 99%, such as between about 1% and about 20%, or between about 1% and about 30%. A pressure of the deposition chamber is between about 1000 mTorr and about 8000 mTorr, in the illustrated embodiment. In some embodiments, the Si precursor forms a monolayer bonded with the underlying layer (e.g., the fin 58).

Still referring to FIG. 8A, at time $T_4$, the oxygen gas is activated into a plasma (e.g., oxygen plasma) using, for example, a capacitively coupled plasma (CCP) system driven by a radio frequency (RF) power supply. A duration between time $T_1$ and time $T_4$ may be between about 0.2 seconds and 50 seconds. In some embodiments, the oxygen plasma is generated in an ambient with oxygen-containing specimen, e.g., $O_2$ or $H_2O$, where the $O_2$ or $H_2O$ may be from (e.g., included in) the gas source. In some embodiments, the oxygen plasma oxidizes the silicon from the precursor to from silicon oxide (e.g., the dummy dielectric layer 60 over the fin 58 in FIG. 7B). The curve 215 illustrates the duration D (e.g., between time $T_4$ and time $T_5$) the RF power supply is turned on to activate the oxygen gas into the oxygen plasma. In some embodiments, the RF power supply of the CCP system has a frequency of 13.56 MHz. In the illustrated example, a power of the RF power supply is between about 10 W and about 1500 W, and a duration when the RF power supply is turned on (e.g., turned on continuously between time $T_4$ and time $T_5$) is between about 0.05 seconds and about 180 seconds.

Figure 8B:
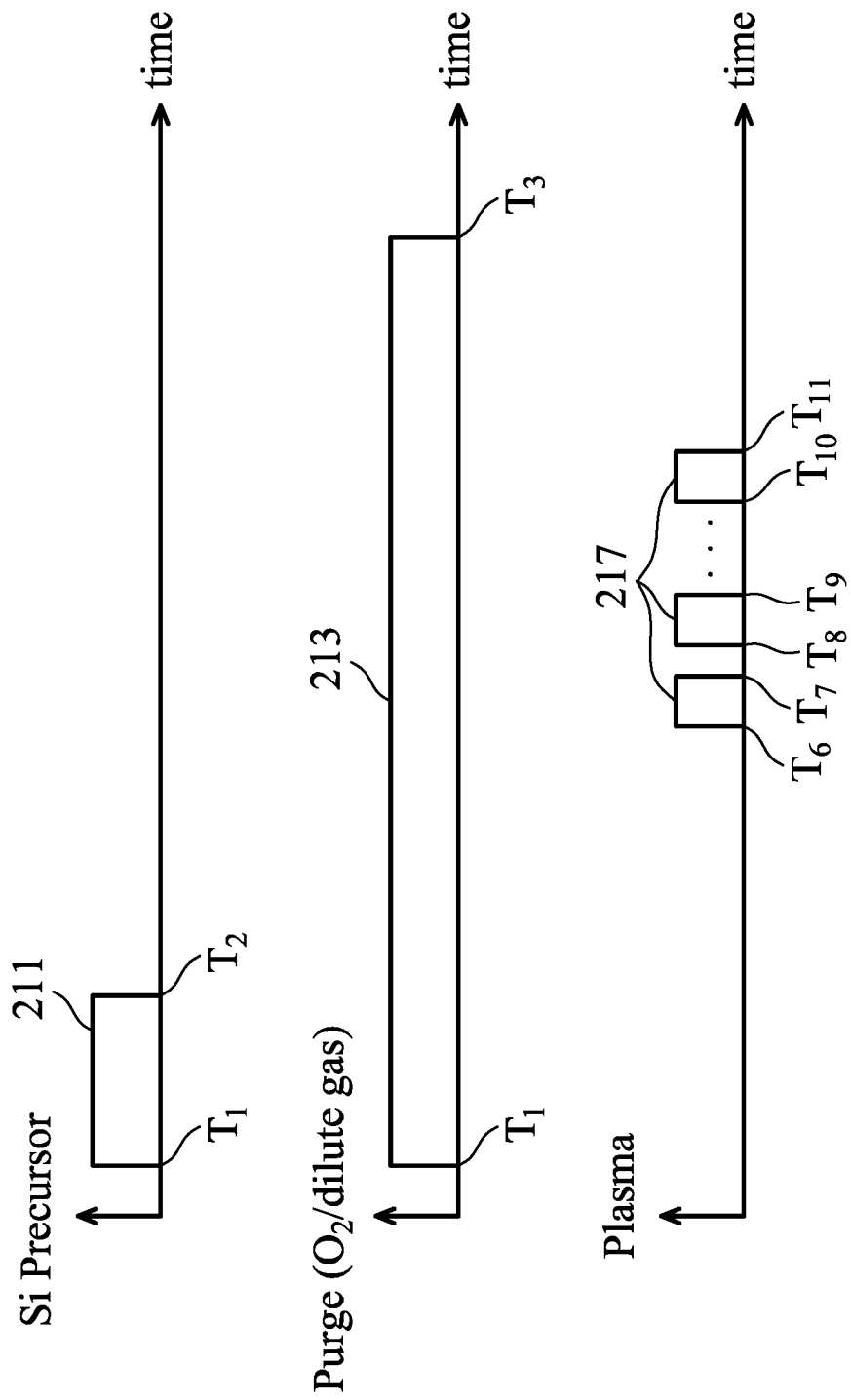
FIG. 8B illustrates a timing diagram of a method for forming a non-conformal oxide layer, in accordance with an embodiment.

FIG. 8B illustrates a timing diagram of another PEALD process for forming a non-conformal oxide layer (e.g., the dummy dielectric layer 60 of FIG. 7B), in accordance with an embodiment. Similar numerals in FIG. 8B refer to the same or similar components/process as in FIG. 8A, thus details are not repeated. The curve 217 illustrates the time the RF power supply is turned on to generate the oxygen plasma. Unlike FIG. 8A, where the RF power supply is turned on continuously for a period of time D (e.g., between time $T_4$ and time $T_5$), the RF power supply in the PEALD process of FIG. 8B is turned on and off repeatedly in each cycle of the PEALD process. Each of the pulses in the curve 217 (e.g., between time $T_6$ and time $T_7$, between time $T_8$ and time $T_9$, and between time $T_{10}$ and $T_{11}$) indicates a time period when the RF power supply is turned on to activate the oxygen gas, and each gap (e.g., between time $T_7$ and time $T_8$) between the pulses indicates a time period when the RF power supply is turned off. Each of the gaps between pulses may have a very short duration, e.g., between about 0.1 seconds and about 5 seconds. In some embodiments, during the transition time when the RF power supply is turned on, the anisotropic characteristics (e.g., non-conformal deposition of the dummy dielectric layer 60 over the fin 58) of the PEALD process is more pronounced, thus having the plurality of pulses (and gaps) in the curve 217 helps to form the shape of the non-conformal dummy dielectric layer 60 (e.g., thicker top portions and thinner sidewall portions). Note that the durations of the gaps between the pulses in the curve 217 may be exaggerated for illustration purpose. In some embodiments, the total duration of the pulses in the curve 217, which is the total duration the RF power supply is on during each cycle of the PEALD process, is between about 0.05 seconds to about 180 seconds. In some embodiments, the anisotropic PEALD process illustrated by FIG. 8B is performed to form the dummy dielectric layer 60 of FIG. 7B.

Figure 9B:
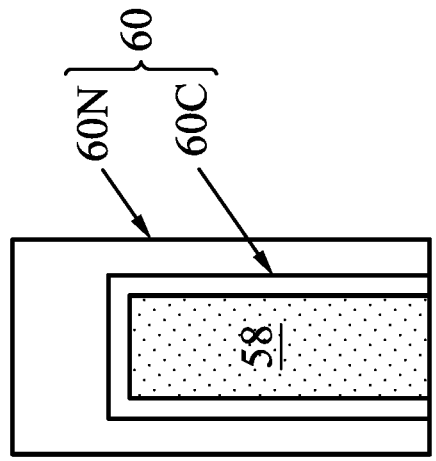
FIGS. 9A and 9B illustrate, respectively, a method for forming a non-conformal oxide layer, and a cross-sectional view of the non-conformal oxide layer formed by the method of FIG. 9A, in accordance with an embodiment.
Figure 9A:
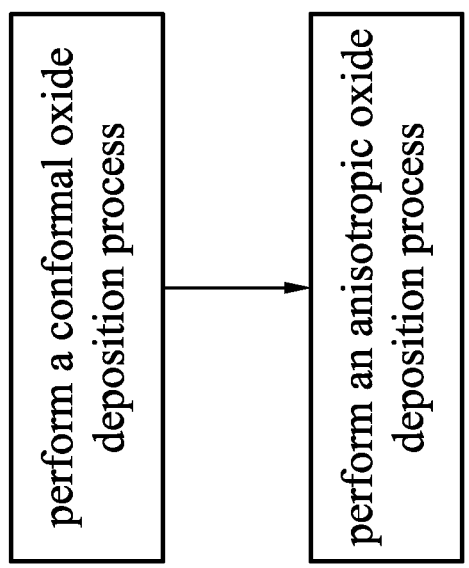

FIG. 9A is a flow chart for another method of forming a non-conformal oxide layer (e.g., the dummy dielectric layer 60 of FIG. 9B), and FIG. 9B illustrates the cross-sectional view of the fin 58 and the non-conformal oxide layer formed over the fin 58 using the method of FIG. 9A. Referring to FIGS. 9A and 9B, the method includes performing a conformal oxide deposition process to form a conformal oxide layer 60C over the top surface and the sidewalls of the fin 58. Two embodiment methods for forming the conformal oxide layer 60C are discussed hereinafter with reference to FIGS. 10 and 11. Next, an anisotropic oxide deposition process is performed to form a non-conformal oxide layer 60N over the conformal oxide layer 60C. The anisotropic oxide deposition process may be performed using, e.g., the PEALD processes illustrated in FIG. 8A or FIG. 8B, thus details are not repeated.

As illustrated in FIG. 9B, the non-conformal oxide layer 60N has a thicker top portion over the top surface of the fin 58, and has thinner sidewall portions along the sidewalls of the fin 58. The conformal oxide layer 60C and the non-conformal oxide layer 60N are collectively referred to as the dummy dielectric layer 60. Details regarding the shape and the dimension of the dummy dielectric layer 60 are discussed above with reference to FIG. 7B, thus are not repeated here. Note that although FIG. 9B illustrates an interface between the conformal oxide layer 60C and the non-conformal oxide layer 60N, the interface may be for illustration purpose and may not be observable in the dummy dielectric layer 60.

Figure 10:
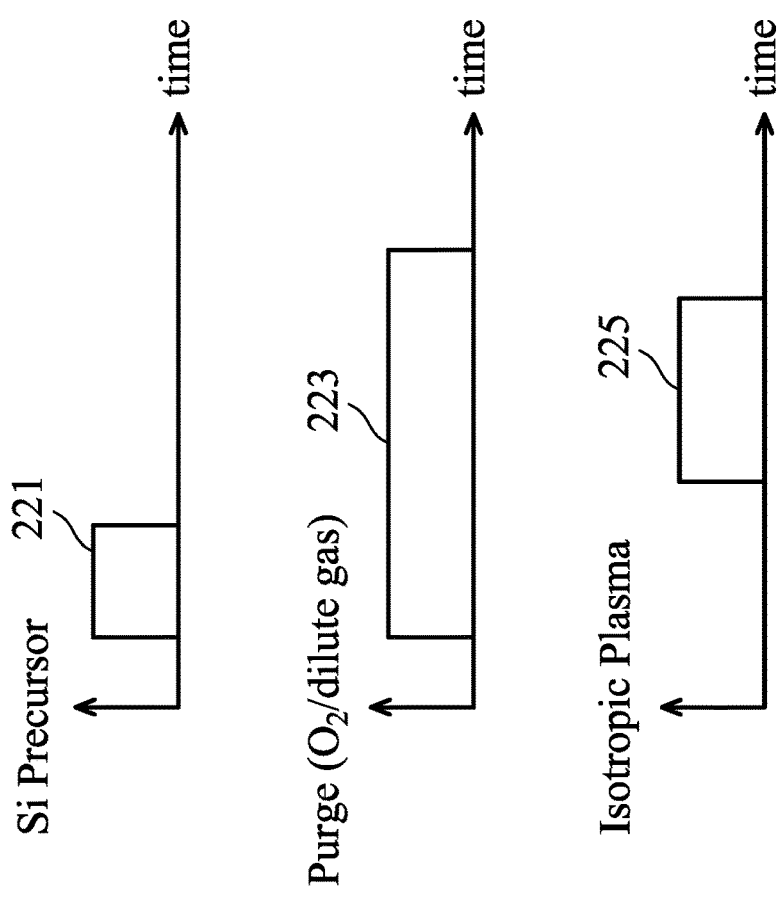

FIG. 10 illustrates the processing in a cycle of a PEALD process for forming a conformal oxide layer (e.g., the conformal oxide layer 60C in FIG. 9B). The PEALD process illustrated by FIG. 10 is similar to the PEALD process of FIG. 8A, but with different parameters for the process conditions to control the profile of the oxide layer formed. In FIG. 10, the curve 221 illustrates the time the precursor is supplied to the deposition chamber, the curve 223 illustrates the time the gas source is supplied to the deposition chamber, and the curve 225 illustrates the time the RF power supply is turned on to activate the oxygen gas into oxygen plasma. Components of the precursor and the gas source may be the same or similar to those of FIG. 8A, thus details are not repeated. In the illustrated embodiment, the processing illustrated in FIG. 10 is performed multiples times (cycles) to form the conformal oxide layer 60C.

In some embodiments, the PEALD process of FIG. 10 uses the CCP system driven by an RF power supply, which RF power supply has a frequency of 13.56 MHz and a power between about 10 W and about 500 W. The RF power supply is turned on for a duration (e.g., duration of the single pulse of the curve 225) between about 1 second and about 10 seconds in each cycle of the PEALD process. The pressure of the PEALD process of FIG. 10 may be between about 3000 mTorr and about 8000 mTorr. A flow rate of the oxygen gas is between about 2000 sccm and about 5000 sccm, and a ratio between the flow rate of the oxygen gas and a sum of the flow rate of oxygen gas and a flow rate of the carrier gas is higher than about 20%, such as between about 20% and about 90%, or between about 20% and about 80%. With the process conditions described above, the PEALD process of FIG. 10 forms the conformal oxide layer 60C over the top surface and the sidewalls of the fin 58, as illustrated in FIG. 9B. Therefore, the PEALD process of FIG. 10 is also referred to as an isotropic PEALD deposition process or an isotropic deposition process.

Figure 11:
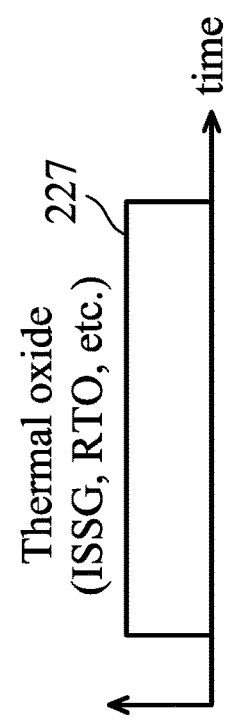
FIGS. 10 and 11 each illustrates a method for forming a conformal oxide layer, in accordance with some embodiment.

FIG. 11 illustrates another embodiment method for forming a conformal oxide layer (e.g., the conformal oxide layer 60C in FIG. 9B). In the example of FIG. 11, a thermal oxidization process is performed to form the conformal oxide layer 60C (e.g., a thermal oxide layer) over the top surface and the sidewalls of the fin 58. The thermal oxidization process illustrated in FIG. 11 may be performed multiple times (cycles) to form the conformal oxide layer 60C of FIG. 9B. The thermal oxidization process may be an in-situ steam generation (ISSG) process or a rapid thermal oxidization (RTO) process, as examples.

Figure 12B:
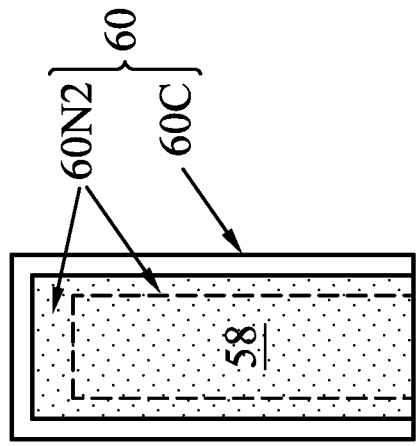
FIGS. 12A and 12B illustrate, respectively, a method for forming a non-conformal oxide layer, and a cross-sectional view of the non-conformal oxide layer formed by the method of FIG. 12A, in accordance with an embodiment.
Figure 12A:
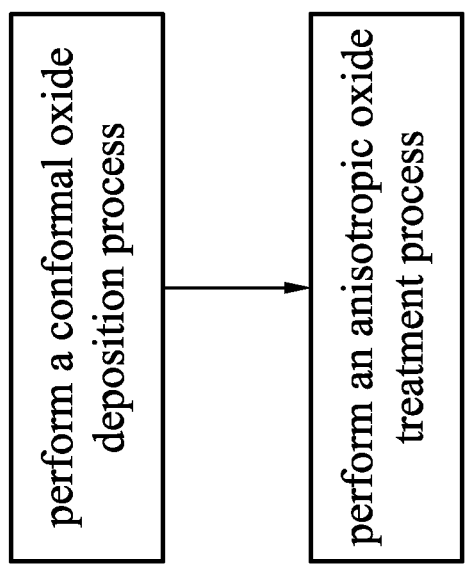

FIG. 12A illustrates a flow chart of a method for forming a non-conformal oxide layer (e.g., the dummy dielectric layer 60 of FIG. 12B), and FIG. 12B illustrates the cross-sectional view of the fin 58 and the non-conformal oxide layer formed over the fin 58 using the method of FIG. 12A. Referring to FIGS. 12A and 12B, the method includes two steps, where the first step includes performing a conformal oxide deposition process to form a conformal oxide layer 60C over the top surface and the sidewalls of the fin 58. The conformal oxide layer 60C may be formed using, e.g., the conformal PEALD deposition process illustrated in FIG. 10 or the thermal oxidization process illustrated in FIG. 11, thus details are not repeated. Next, an anisotropic plasma treatment process is performed to covert exterior portions of the fin 58 into an oxide layer 60N2, where the exterior portions of the fins 58 refer to the portions of the fin 58 proximate the upper surface and the sidewalls of the fin 58. In some embodiments, the plasma (e.g., oxygen plasma) used in the anisotropic plasma treatment process travels through the conformal oxide layer 60C and reacts with the material (e.g., silicon) of the fin 58 to form an oxide layer 60N2 (e.g., silicon oxide). The dashed line in FIG. 12B indicates an interface between the fin 58 and the converted oxide layer 60N2 after the anisotropic plasma treatment process, where the interface may or may not comprise straight lines as illustrated by the dashed line.

Due to the anisotropy of the anisotropic plasma treatment process, top portions of the fin 58 are more likely to be converted into oxide than sidewall portions of the fin 58, and therefore, portions of the oxide layer 60N2 proximate the top surface of the fin 58 is thicker than portions of the oxide layer 60N2 proximate the sidewalls of the fin 58. Therefore, the oxide layer 60N2 is a non-conformal oxide layer. The non-conformal oxide layer 60N2 and the conformal oxide layer 60C are collectively referred to as the dummy dielectric layer 60. Details regarding the shape and the dimension of the dummy dielectric layer 60 are discussed above with reference to FIG. 7B, thus are not repeated here. Note that although FIG. 12B illustrates an interface between the conformal oxide layer 60C and the non-conformal oxide layer 60N2, the interface may be for illustration purpose and may not be observable in the dummy dielectric layer 60.

Figure 13:
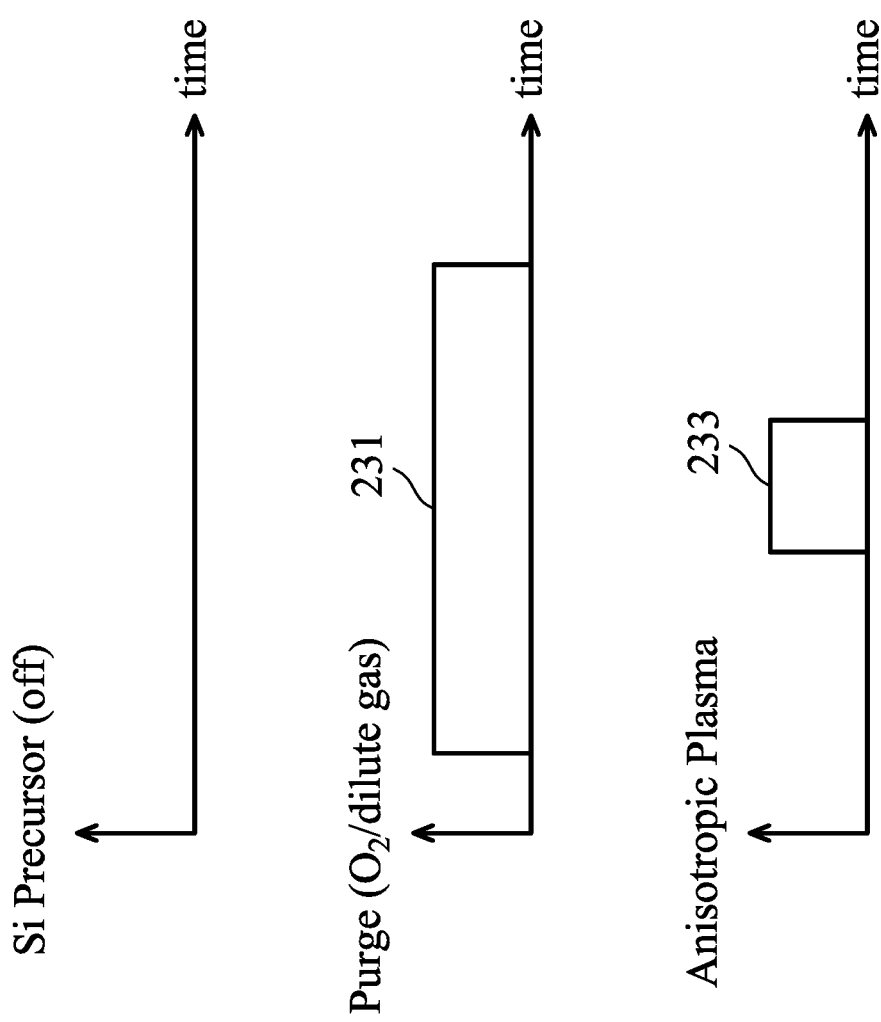
FIG. 13 illustrates a diagram of an anisotropic plasma treatment, in accordance with an embodiment.

FIG. 13 illustrates a cycle of the anisotropic plasma treatment process of FIG. 12A, in some embodiments. In other words, the processing of FIG. 13 are performed multiple times (cycles) during the anisotropic plasma treatment process. In the processing of FIG. 13, no precursor is supplied to the deposition chamber. A source gas, which is the same as or similar to the gas source of FIG. 8A, is supplied to the deposition chamber for a period of time, similar to FIG. 8A. While the gas source is being supplied to the deposition chamber, the oxygen gas in the gas source is activated into oxygen plasma using a CCP system driven by an RF power supply, in some embodiments. Compared with the anisotropic PEALD deposition process illustrated in FIG. 8A, the process conditions of the anisotropic plasma treatment process are the same as that of FIG. 8A, except that no precursor is supplied to the deposition chamber, in some embodiments.

Figure 14B:
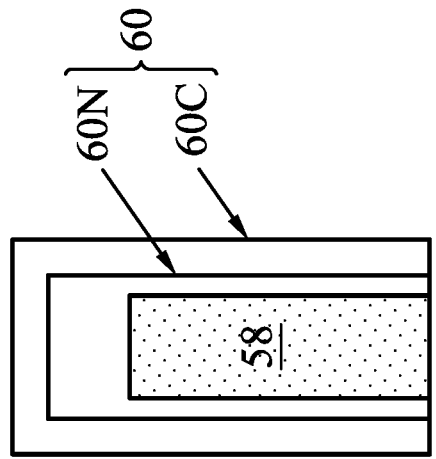
FIGS. 14A and 14B illustrate, respectively, a method for forming a non-conformal oxide layer, and a cross-sectional view of the non-conformal oxide layer formed by the method of FIG. 14A, in accordance with an embodiment.
Figure 14A:
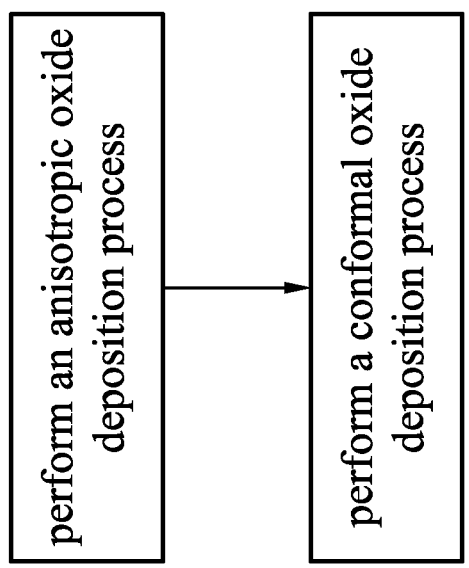

FIG. 14A illustrates a flow chart of a method of forming a non-conformal oxide layer (e.g., the dummy dielectric layer 60 of FIG. 14B), and FIG. 14B illustrates the cross-sectional view of the fin 58 and the non-conformal oxide layer formed over the fin 58 using the method of FIG. 14A. Referring to FIGS. 14A and 14B, the method includes performing an anisotropic oxide deposition process to form a non-conformal oxide layer 60N over the top surface and along the sidewalls of the fin 58. The anisotropic oxide deposition process may be performed using, e.g., the PEALD processes illustrated in FIG. 8A or FIG. 8B. Next, a conformal oxide layer 60C is formed over the non-conformal oxide layer 60N. The conformal oxide layer 60C may be formed using, e.g., the conformal PEALD deposition process illustrated in FIG. 10 or the thermal oxidization process illustrated in FIG. 11. The conformal oxide layer 60C and the non-conformal oxide layer 60N are collectively referred to the dummy dielectric layer 60. Details regarding the shape and the dimension of the dummy dielectric layer 60 are discussed above with reference to FIG. 7B, thus are not repeated here. Note that although FIG. 14B illustrates an interface between the conformal oxide layer 60C and the non-conformal oxide layer 60N, the interface may be for illustration purpose and may not be observable in the dummy dielectric layer 60.

Figure 15B:
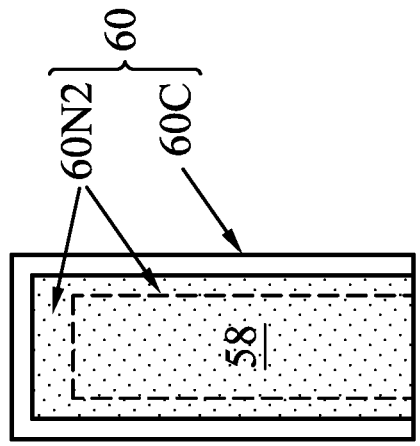
FIGS. 15A and 15B illustrate, respectively, a method for forming a non-conformal oxide layer, and a cross-sectional view of the non-conformal oxide layer formed by the method of FIG. 15A, in accordance with an embodiment.
Figure 15A:
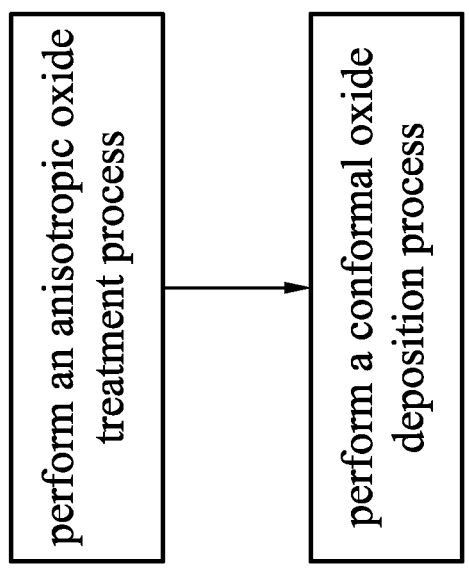

FIG. 15A illustrates a flow chart of a method of forming a non-conformal oxide layer (e.g., the dummy dielectric layer 60 of FIG. 15B), and FIG. 15B illustrates the cross-sectional view of the fin 58 and the non-conformal oxide layer formed over the fin 58 using the method of FIG. 15A. Referring to FIGS. 15A and 15B, the method includes performing an anisotropic oxide treatment process to convert exterior portions of the fin 58 into a non-conformal oxide layer 60N2, where the non-conformal oxide layer 60N2 is disposed over the top surface and along the sidewalls of the fin 58 after the anisotropic oxide treatment process. The anisotropic oxide treatment process may be performed using the anisotropic oxide treatment process illustrated in FIG. 13. Next, a conformal oxide layer 60C is formed over the non-conformal oxide layer 60N2. The conformal oxide layer 60C may be formed using, e.g., the conformal PEALD deposition process illustrated in FIG. 10 or the thermal oxidization process illustrated in FIG. 11. The conformal oxide layer 60C and the non-conformal oxide layer 60N2 are collectively referred to the dummy dielectric layer 60. Details regarding the shape and the dimension of the dummy dielectric layer 60 are discussed above with reference to FIG. 7B, thus are not repeated here. Note that although FIG. 15B illustrates an interface between the conformal oxide layer 60C and the non-conformal oxide layer 60N2, the interface may be for illustration purpose and may not be observable in the dummy dielectric layer 60.

Various embodiment methods for forming the non-conformal dummy dielectric layer 60 are discussed above. The non-conformal dummy dielectric layer 60 has thick top portions and thin sidewall portions, where the thick top portions protect the fins 58 from damage in a subsequent etching processing in a replacement gate process, and the thin sidewall portions allows for FinFETs to be disposed closer to each other for higher integration density, and/or allows for easier gap fill between adjacent fins 58, which is especially advantageous as feature size continues to shrink in advanced manufacturing processing nodes.

The non-conformal dummy dielectric layers 60 illustrated in FIGS. 9B, 12B, 14B, and 15B each comprises two layers of oxide (e.g., 60C and 60N in FIG. 9B, 60C and 60N2 in FIG. 12B). In other embodiments, one of the two layers (e.g., 60C) of the non-conformal dummy dielectric layer 60 in FIGS. 9B, 12B, 14B, and 15B is formed of a material different from oxide, such as silicon nitride, silicon oxynitride, or the like, in which case there is an interface between the two layers of the non-conformal dummy dielectric layer 60. These and other variations are fully intended to be included within the scope of the present disclosure.

FIGS. 16A through 24B illustrate various additional steps in the manufacturing of the FinFET device following the processing in FIG. 7A. FIGS. 16A through 24B illustrate features in either of the region 50B and the region 50C. For example, the structures illustrated in FIGS. 16A through 24B may be applicable to both the region 50B and the region 50C. Differences (if any) in the structures of the region 50B and the region 50C are described in the text accompanying each figure.

Figure 16B:
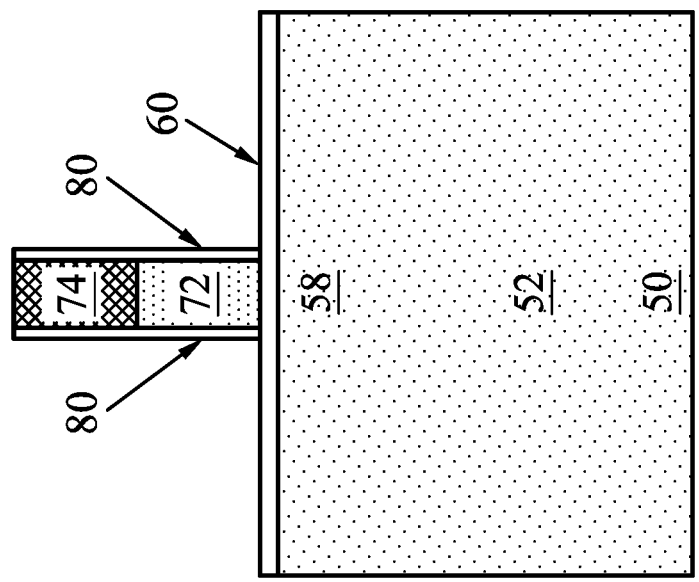
FIGS. 16A, 16B, 17A, 17B, 18A, 18B, 18C, 18D, 19A, 19B, 20A, 20B, 21A, 21B, 22A, 22B, 23A, 23B, 24A, and 24B are cross-sectional views of the FinFET device of FIG. 7A at additional processing stages, in accordance with an embodiment.
Figure 16A:
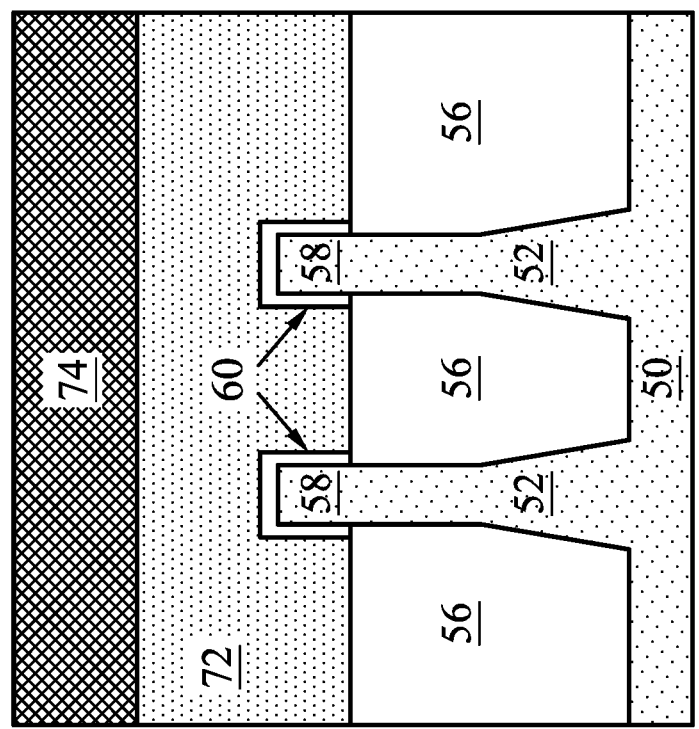

In FIGS. 16A and 16B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52/58.

Further in FIGS. 16A and 16B, gate seal spacers 80 may be formed on exposed surfaces of the dummy gates 72, the masks 74, and/or the fins 58. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50B, while exposing the region 50C, and appropriate type (e.g., n-type or p-type) impurities may be implanted into the exposed fins 58 in the region 50C. The mask may then be removed. Subsequently, a mask, such as a photoresist, may be formed over the region 50C while exposing the region 50B, and appropriate type impurities may be implanted into the exposed fins 58 in the region 50B. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Figure 17B:
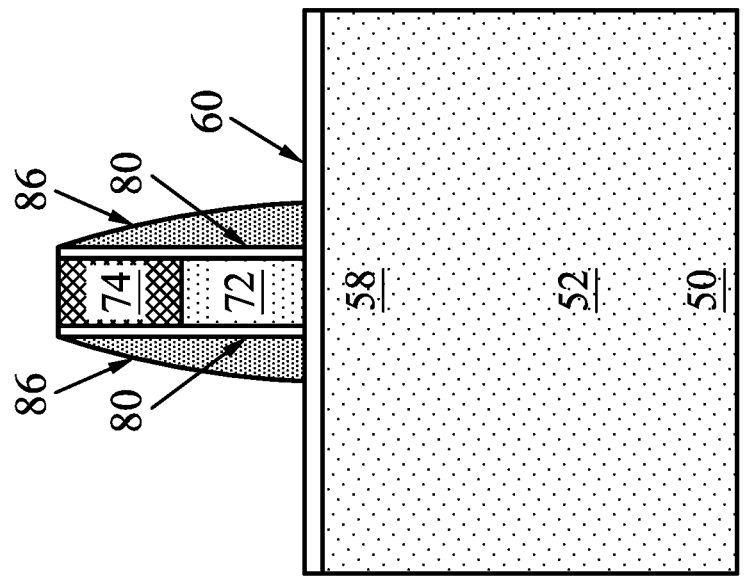
Figure 17A:
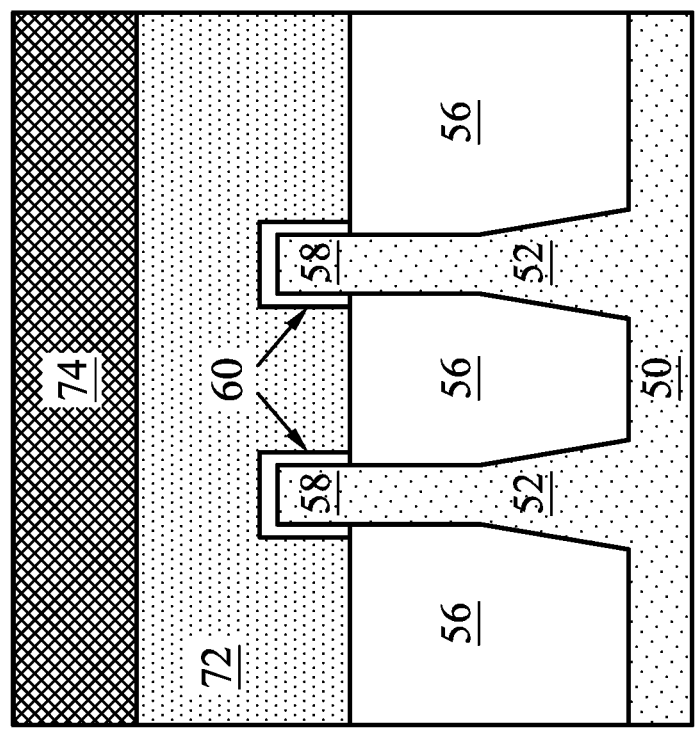

Next, in FIGS. 17A and 17B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like.

Figure 18B:
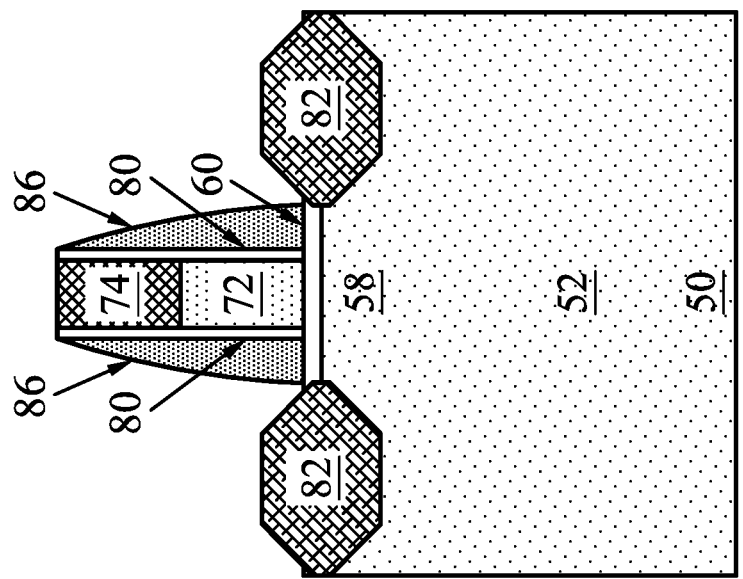
Figure 18A:
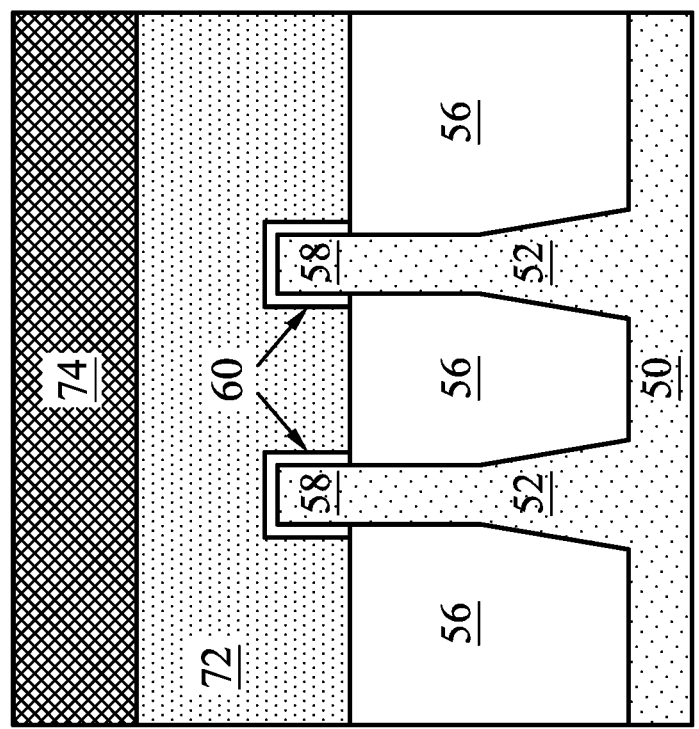
Figure 18C:
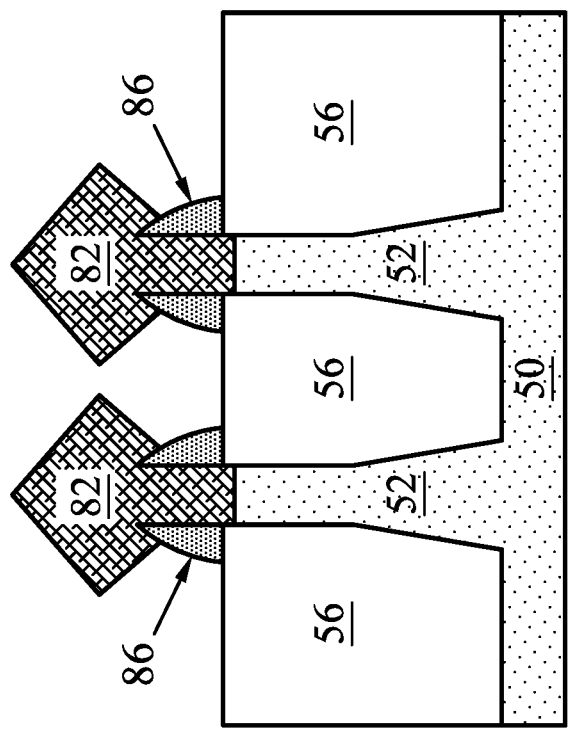
Figure 18D:
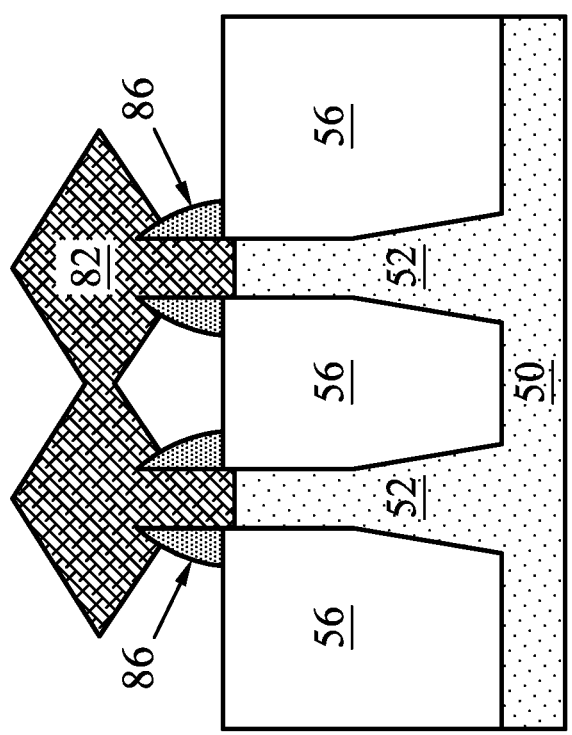

Next, in FIGS. 18A and 18B epitaxial source/drain regions 82 are formed in the fins 58. The epitaxial source/drain regions 82 are formed in the fins 58 such that each dummy gate 72 is disposed between respective neighboring pairs of the epitaxial source/drain regions 82. In some embodiments, the epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFET device.

The epitaxial source/drain regions 82 in the region 50B, e.g., the NMOS region, may be formed by masking the region 50C, e.g., the PMOS region, and etching source/drain regions of the fins 58 in the region 50B to form recesses in the fins 58. Then, the epitaxial source/drain regions 82 in the region 50B are epitaxially grown in the recesses. The epitaxial source/drain regions 82 may include any acceptable material, such as appropriate for n-type FinFETs. For example, if the fin 58 is silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and etching source/drain regions of the fins 58 in the region 50C to form recesses in the fins 58. Then, the epitaxial source/drain regions 82 in the region 50C are epitaxially grown in the recesses. The epitaxial source/drain regions 82 may include any acceptable material, such as appropriate for p-type FinFETs. For example, if the fin 58 is silicon, the epitaxial source/drain regions 82 in the region 50C may comprise SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50B and the region 50C, upper surfaces of the epitaxial source/drain regions have facets which expand laterally outward beyond a sidewalls of the fins 58. In some embodiments, these facets cause adjacent source/drain regions 82 of a same FinFET device to merge as illustrated by FIG. 18C. In other embodiments, adjacent source/drain regions 82 remain separated after the epitaxy process is completed as illustrated by FIG. 18D.

Figure 19B:
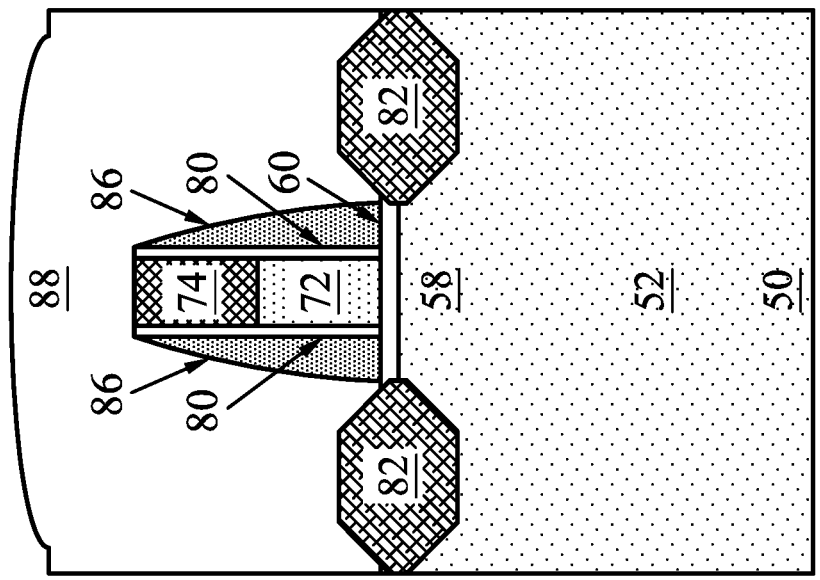
Figure 19A:
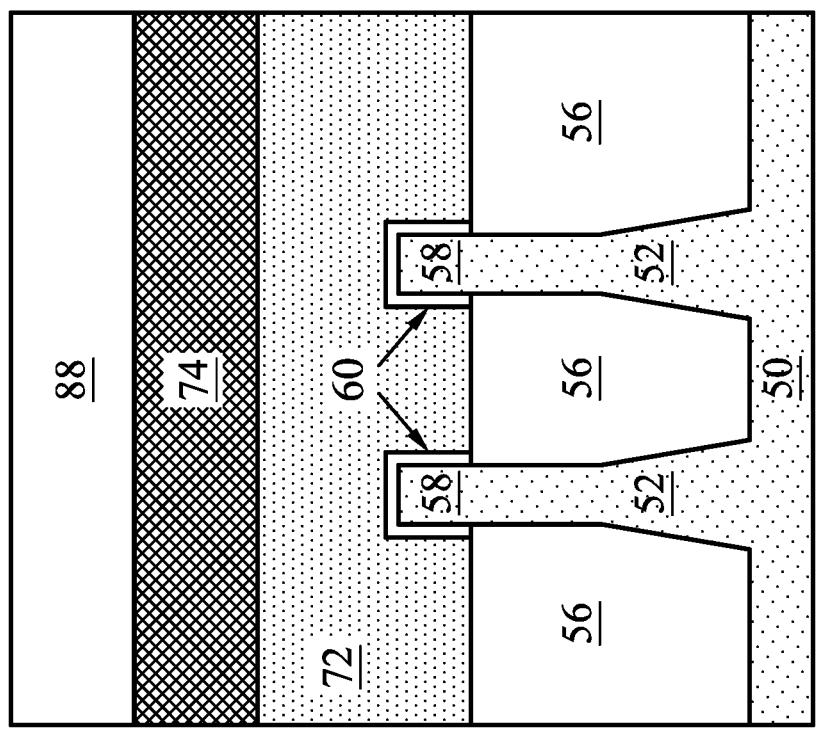

Next, in FIGS. 19A and 19B, an interlayer dielectric layer (ILD) 88 is deposited over the structure illustrated in FIGS. 18A and 18B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL), not illustrated, is disposed between the ILD 88 and the epitaxial source/drain regions 82, the mask 74, and the gate spacers 86.

Figure 20B:
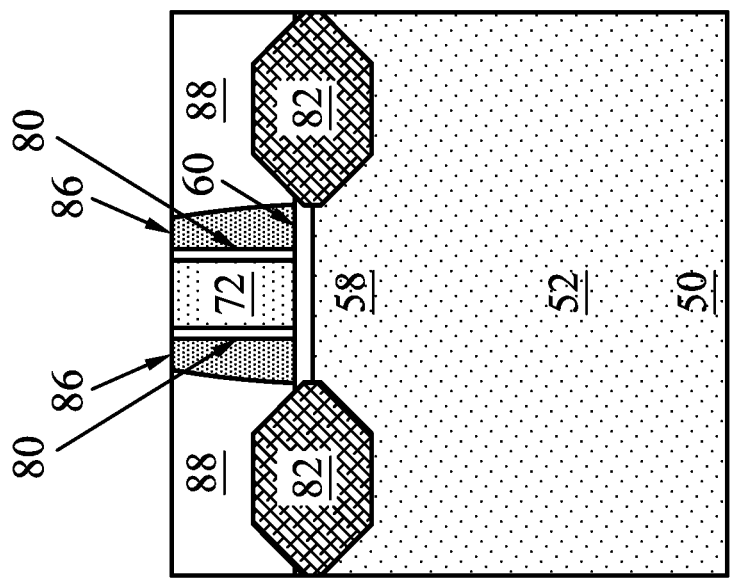
Figure 20A:
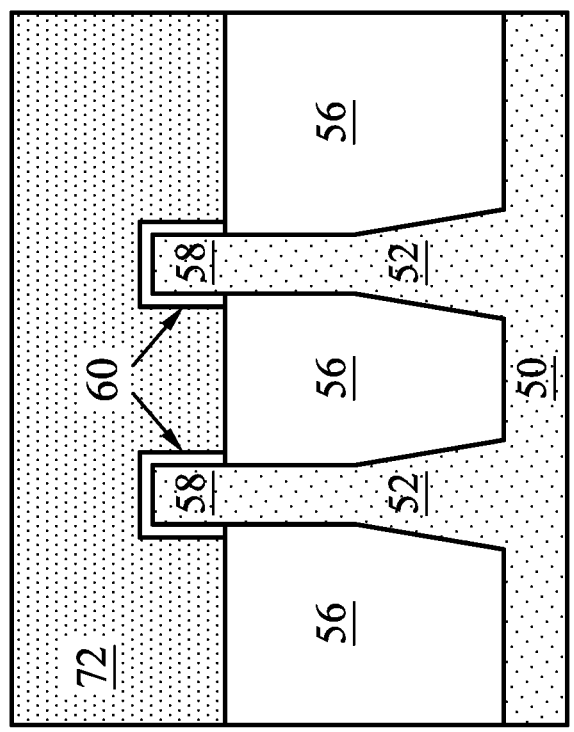

Next, in FIGS. 20A and 20B, a planarization process, such as a CMP, may be performed to level the top surface of the ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 21B:
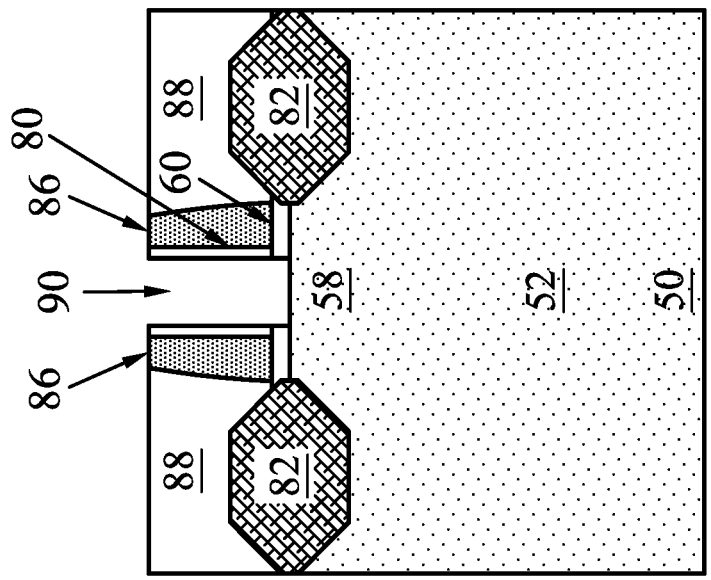
Figure 21A:
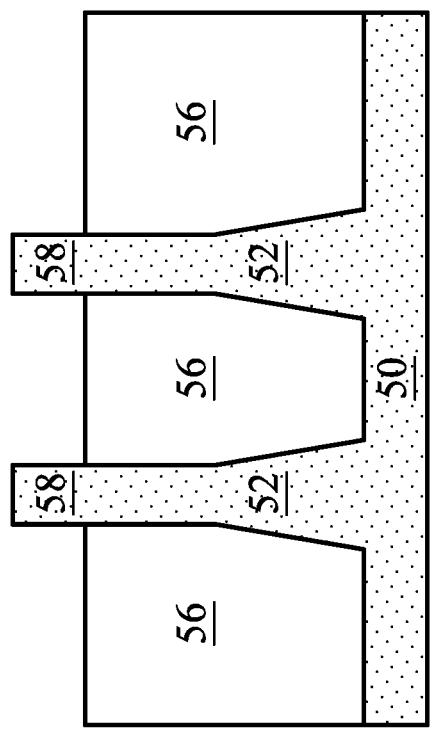

In FIGS. 21A and 21B, the dummy gates 72 and portions of the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82. During the removal, the dummy dielectric layer 60 may be used as an etch stop layer when the dummy gates 72 are etched. The dummy dielectric layer 60 may then be removed after the removal of the dummy gates 72. The etching process to form the recesses 90 may over etch and damage the top of the fin 58 exposed by the recess 90. In some embodiments, the thicker top portion of the non-conformal dummy dielectric layer 60 prevents or reduces the occurrence of over-etch, thus improving the yield of the semiconductor manufacturing process.

Figure 22B:
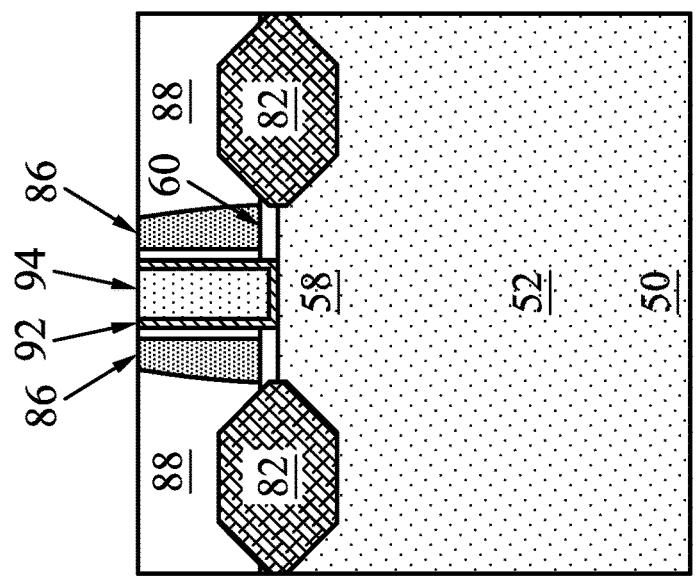
Figure 22A:
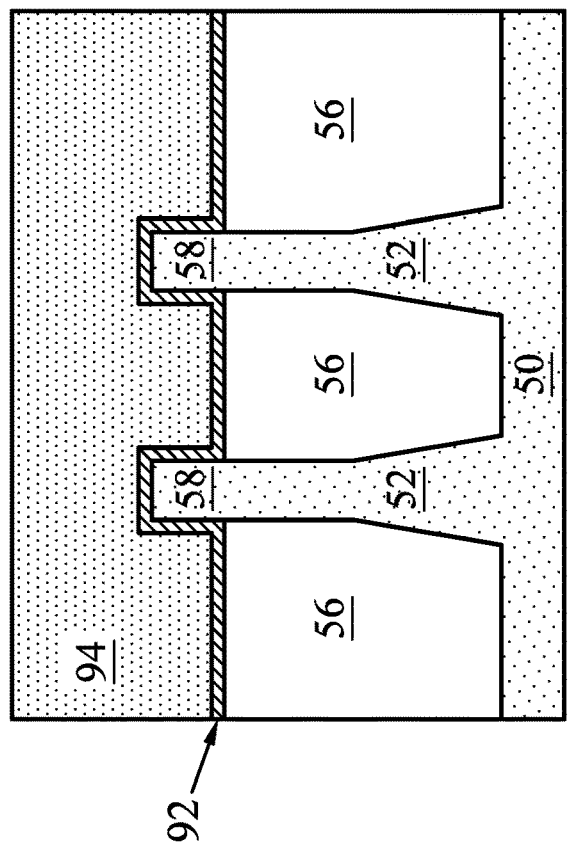

Next, in FIGS. 22A and 22B, gate dielectric layers 92 and gate electrodes 94 are formed for replacement gates. Gate dielectric layers 92 are deposited conformally in the recesses 90, such as on the top surfaces and the sidewalls of the fins 58 and on sidewalls of the gate seal spacers 80/gate spacers 86. The gate dielectric layers 92 may also be formed on top surface of the ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), atomic layer deposition (ALD), PECVD, and the like.

The gate electrodes 94 are deposited over the gate dielectric layers 92, respectively, and fill the remaining portions of the recesses 90. The gate electrodes 94 may be a metal-containing material such as TiN, TaN, TaC, Co, Ru, Al, combinations thereof, or multi-layers thereof. For example, although a single gate electrode 94 is illustrated, any number of work function tuning layers may be deposited in the recesses 90. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFET device. The gate electrodes 94 and the gate dielectric layers 92 may be collectively referred to as a gate structure or a gate stack. The gate stacks may extend along sidewalls of a channel region of the fins 58.

The formation of the gate dielectric layers 92 in the region 50B and the region 50C may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and the gate electrodes 94 in each region may be formed by distinct processes, such that the gate electrodes 94 may be different materials. Various masking steps may be used to mask and expose appropriate regions when using distinct processes.

Figure 23B:
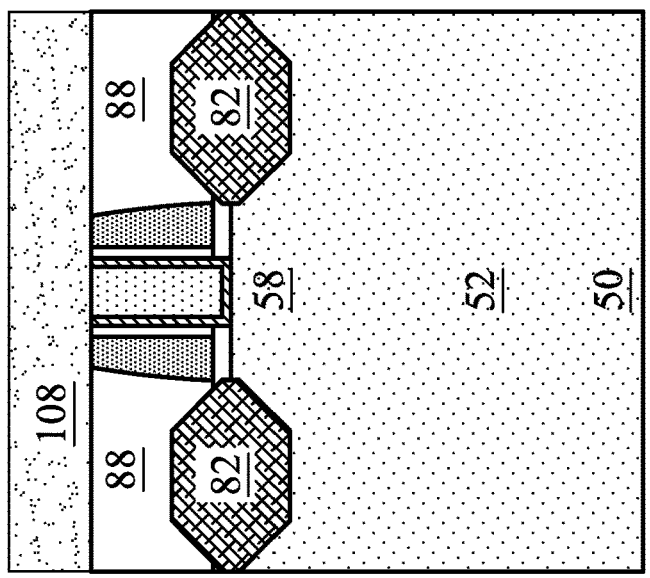
Figure 23A:
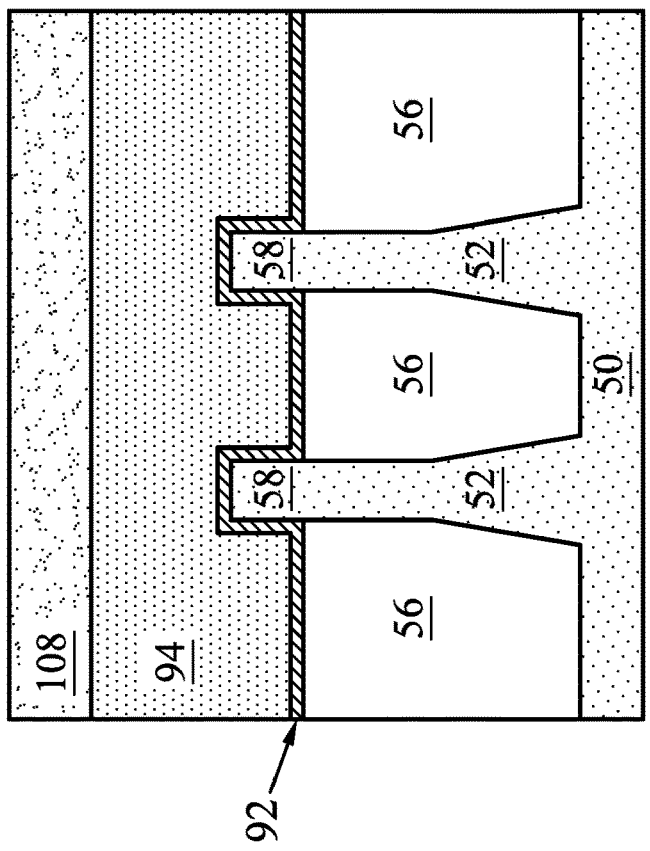

Next, in FIGS. 23A and 23B, an ILD 108 is deposited over the ILD 88. In an embodiment, the ILD 108 is a flowable film formed by a flowable CVD method. In some embodiments, the ILD 108 is formed of a dielectric material such as PSG, BSG, BPSG, USG, or the like, and may be deposited by any suitable method, such as CVD and PECVD.

Figure 24B:
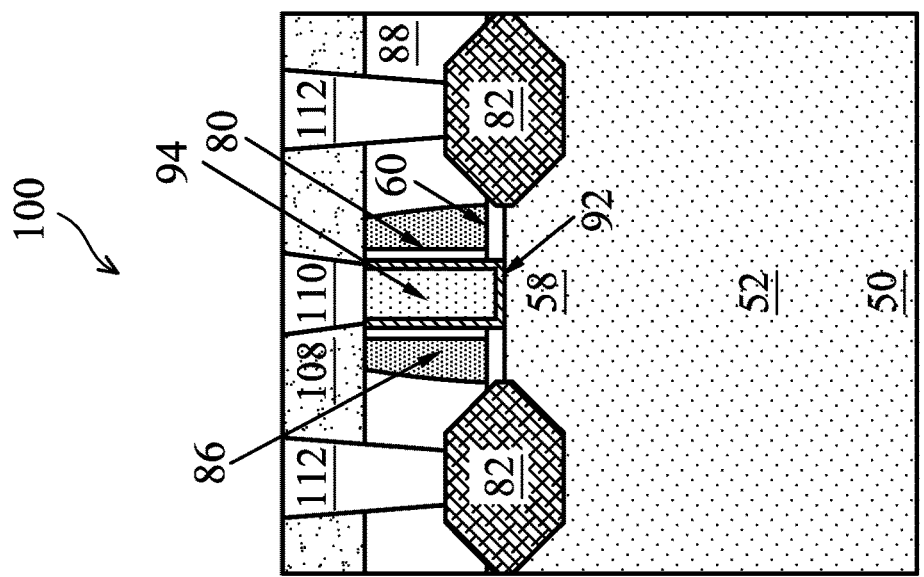
Figure 24A:
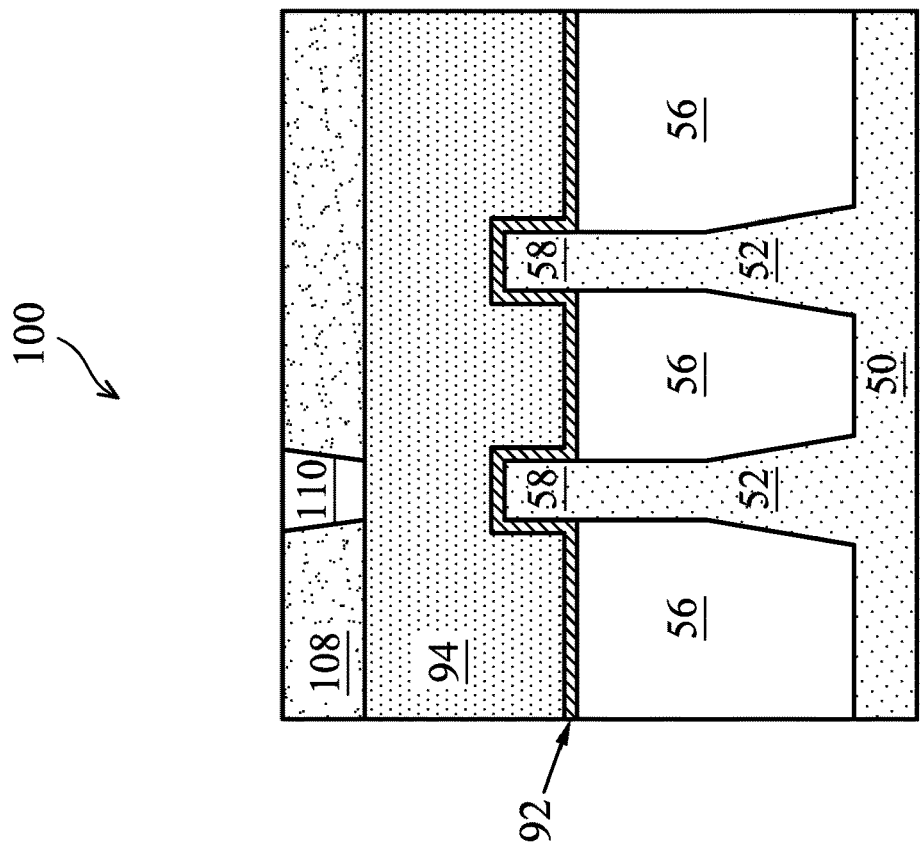

Next, in FIGS. 24A and 24B, contacts 110 and 112 are formed through the ILD 108 and/or the ILD 88 to form the FinFET device 100. In some embodiments, an anneal process may be performed to form a silicide at the interface between the epitaxial source/drain regions 82 and the contacts 112 prior to the contacts 112 being formed. The contact 110 is electrically connected to the gate electrode 94, and the contacts 112 are electrically connected to the epitaxial source/drain regions 82. FIGS. 24A and 24B illustrate the contacts 110 and 112 in a same cross-section; however, in other embodiments, the contacts 110 and 112 may be disposed in different cross-sections. Further, the positions of the contacts 110 and 112 in FIGS. 24A and 24B are merely illustrative and not intended to be limiting in any way. For example, the contact 110 may be vertically aligned with the fin 52 as illustrated or may be disposed at a different location on the gate electrode 94. Furthermore, the contacts 112 may be formed prior to, simultaneously with, or after forming the contacts 110.

Figure 25B:
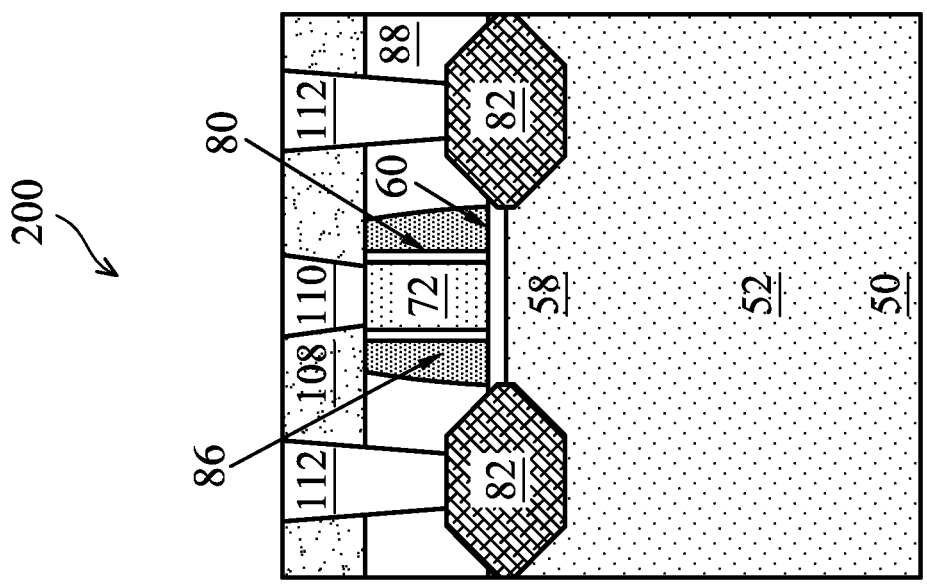
FIGS. 25A and 25B illustrate cross-sectional views of a FinFET device, in an embodiment.
Figure 25A:
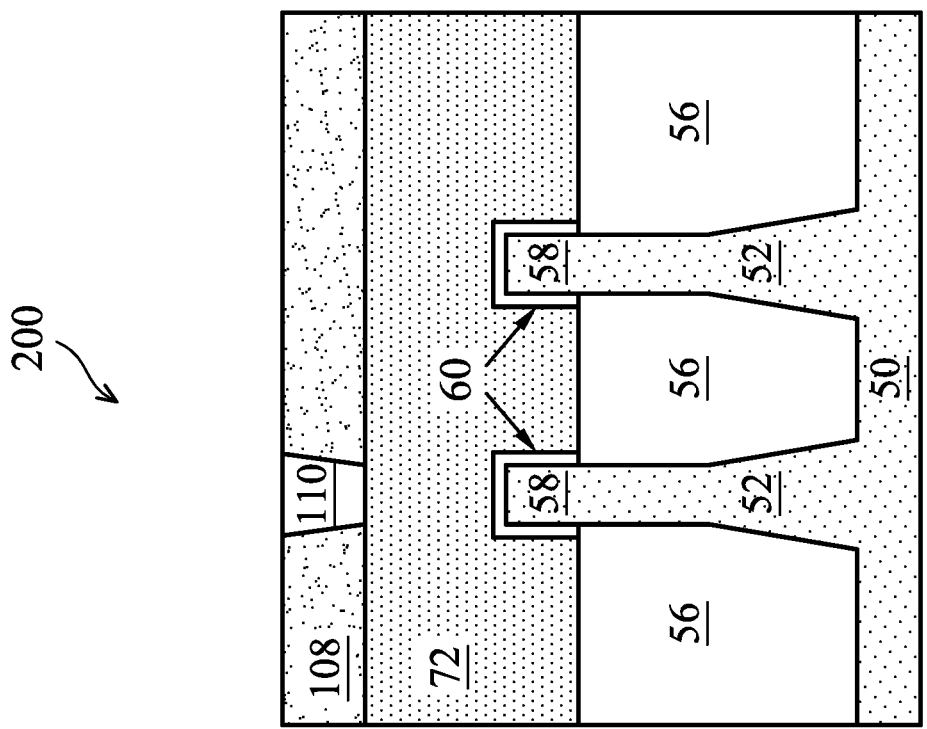

FIGS. 21A-24B illustrates the replacement gate process, where the non-conformal dummy dielectric layer 60 disposed over the channel region and the dummy gate 72 illustrated in FIGS. 20A and 20B are replaced by the conformal gate dielectric layer 92 and the gate electrode 94, respectively. In other embodiments, e.g., in a gate first process as illustrated in FIGS. 25A and 25B, the replace gate process is not performed. Instead, as illustrated in FIGS. 25A and 25B, ILDs 88 and 108 are formed over the structure illustrated in FIGS. 20A and 20B, and the contacts 110 and 112 are formed in the ILDs 108 and/or 88 to electrically connect with the dummy gate 72 and the epitaxial source/drain regions 82. Therefore, in the example of FIGS. 25A and 25B, the non-conformal dummy dielectric layer 60 and the dummy gate 72 remain in the final FinFET device 200 formed, and serve as the gate dielectric layer and the gate electrode of the final FinFET device 200 formed, respectively.

Figure 26:
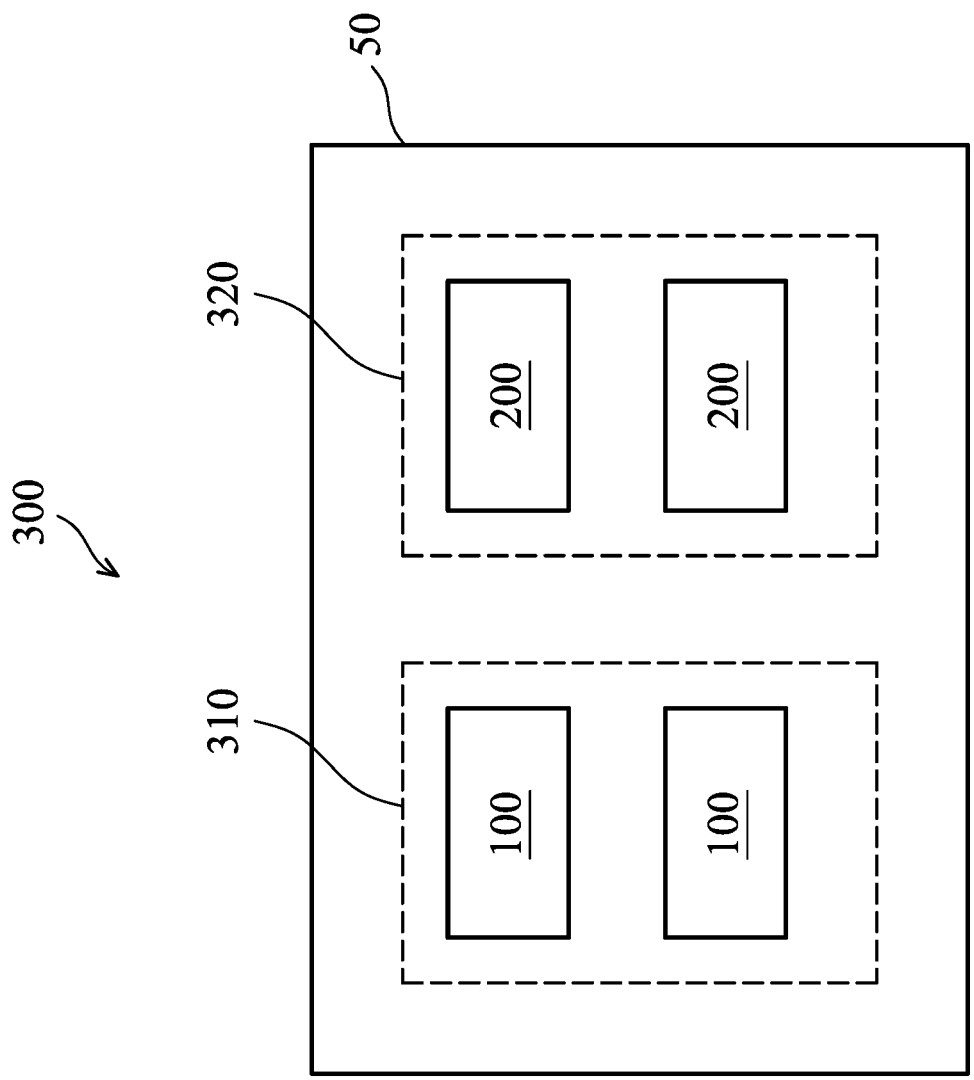
FIG. 26 illustrates a top view of a semiconductor device, in an embodiment.

FIG. 26 illustrates a top view of a semiconductor device 300 (e.g., a semiconductor die). In the embodiment of FIG. 26, one or more FinFET devices 100 with conformal gate dielectric layer 92 (as illustrated in FIGS. 24A and 24B) are formed in a first region 310 of the semiconductor device 300, and one or more FinFET devices 200 with non-conformal gate dielectric layer 60 (as illustrated in FIGS. 25A and 25B) are formed in a second region 320 of the semiconductor device 300. In other words, the semiconductor device 300 has, on a same substrate 50, the FinFET devices 100 with conformal gate dielectric layer 92 and the FinFET devices 200 with non-conformal gate dielectric layer 60. The FinFET devices 100 may have lower gate resistance and faster switching speed (e.g., due to the metal gate formed), and the FinFET device 200 may have lower production cost due to less processing steps. Therefore, it may be advantageous to form both types of FinFET devices (e.g., 100 and 200) in different regions of a same semiconductor die to achieve a balance between device performance and device cost.

Embodiments may achieve various advantages. For example, the non-conformal dummy dielectric layer 60 has thick top portions over the fins 58 and as thin sidewall portions along the sidewalls of the fin 58. The thick top portions protect the fins 58 from damage in the subsequent etching processing of the replacement gate process, and the thin sidewall portions allows for higher integration density of the FinFETs, and allows for easier gap fill between adjacent fins 58 due to the larger space offered by the thin sidewall portions. This is especially advantageous as device size continues to shrink in advanced manufacturing processing nodes.

Figure 27:
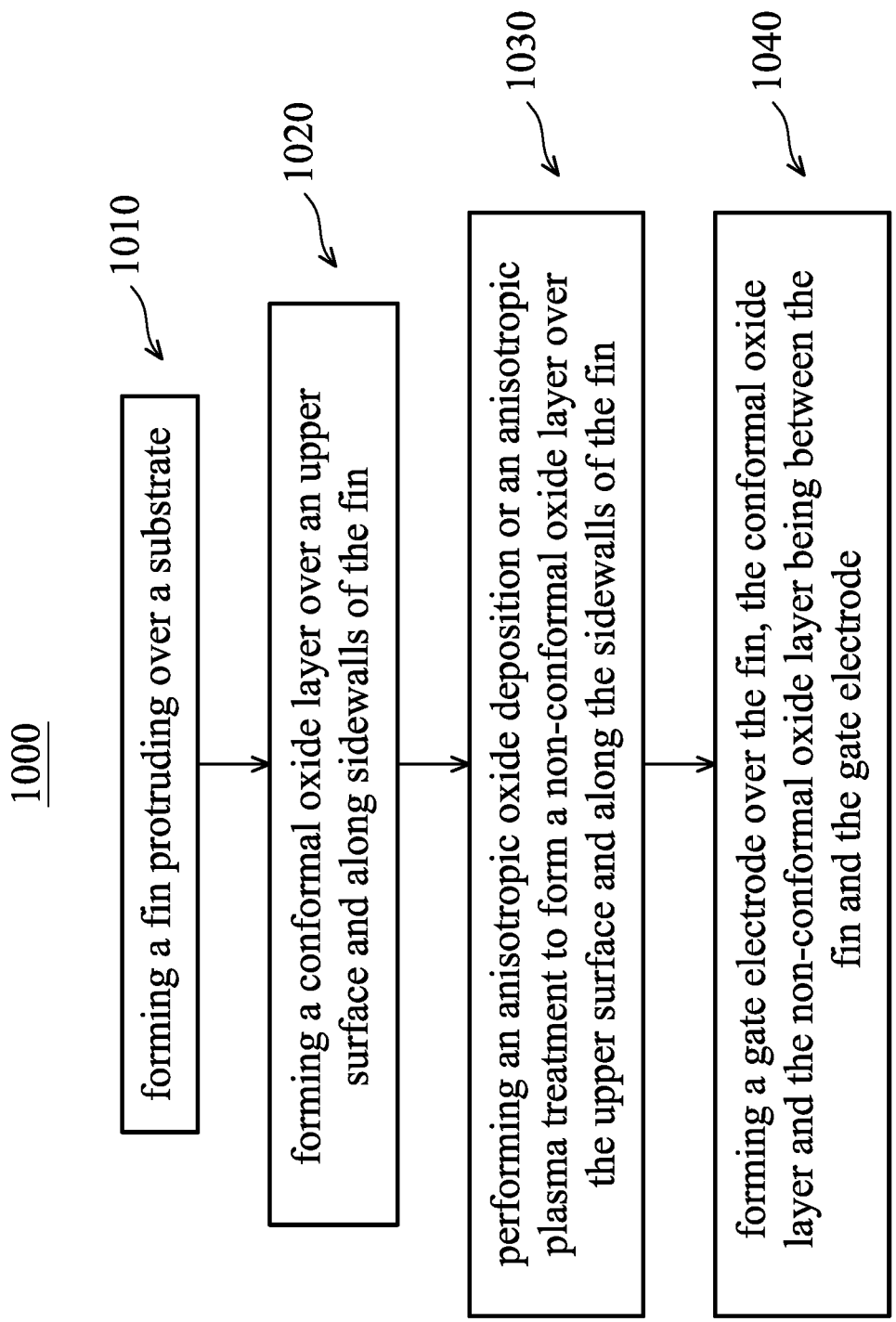
FIG. 27 is a flow chart of a method for forming a semiconductor structure, in some embodiments.

FIG. 27 illustrates a flow chart of a method of fabricating a semiconductor structure, in accordance with some embodiments. It should be understood that the embodiment method shown in FIG. 27 is merely an example of many possible embodiment methods. One of ordinary skill in the art would recognize many variations, alternatives, and modifications. For example, various steps as illustrated in FIG. 27 may be added, removed, replaced, rearranged and repeated.

Referring to FIG. 27, at block 1010, a fin is formed protruding over a substrate. At block 1020, a conformal oxide layer is formed over an upper surface and along sidewalls of the fin. At block 1030, an anisotropic oxide deposition or an anisotropic plasma treatment is performed to form a non-conformal oxide layer over the upper surface and along the sidewalls of the fin. At block 1040, a gate electrode is formed over the fin, where the conformal oxide layer and the non-conformal oxide layer are between the fin and the gate electrode.

In an embodiment, a method includes forming a fin protruding over a substrate; forming a conformal oxide layer over an upper surface and along sidewalls of the fin; performing an anisotropic oxide deposition or an anisotropic plasma treatment to form a non-conformal oxide layer over the upper surface and along the sidewalls of the fin; and forming a gate electrode over the fin, the conformal oxide layer and the non-conformal oxide layer being between the fin and the gate electrode. In an embodiment, the non-conformal oxide layer disposed over the upper surface of the fin is thicker than the non-conformal oxide layer disposed along the sidewalls of the fin. In an embodiment, the anisotropic oxide deposition or the anisotropic plasma treatment is performed before forming the conformal oxide layer. In an embodiment, the anisotropic oxide deposition or the anisotropic plasma treatment is performed after forming the conformal oxide layer. In an embodiment, the anisotropic oxide deposition is a plasma process, where the plasma process includes a plurality of cycles, and where the plasma process is performed using a precursor including silicon and using a gas source including an oxygen gas. In an embodiment, the oxygen gas is activated into plasma by a capacitively coupled plasma (CCP) system driven by a radio frequency (RF) power supply, where a power of the RF power supply is between about 10 W and about 1500 W. In an embodiment, the RF power supply is turned on and off repeatedly in each cycle of the plasma process. In an embodiment, the RF power supply is turned on continuously for a duration between about 0.05 second and about 180 seconds in each cycle of the plasma process. In an embodiment, the gas source further includes a carrier gas, where a pressure of the plasma process is between about 1000 mTorr and about 8000 mTorr, a flow rate for the oxygen gas is between about 50 standard cubic centimeter per minute (sccm) and about 5000 sccm, and a ratio between the flow rate of the oxygen gas and a total flow rate of the gas source is between about 1% and about 20%. In an embodiment, the anisotropic plasma treatment converts exterior portions of the fin into the non-conformal oxide layer, where the converted non-conformal oxide layer is thicker at the upper surface of the fin than along the sidewalls of the fin. In an embodiment, the anisotropic plasma treatment includes a plurality of cycles, and is performed using a gas source including an oxygen gas and a carrier gas, the oxygen gas is activated into plasma for a period between about 0.05 second and about 180 seconds in each cycle of the anisotropic plasma treatment, and a power of the anisotropic plasma treatment is between about 10 W and about 1500 W. In an embodiment, a pressure of the anisotropic plasma treatment is between about 1000 mTorr and about 8000 mTorr, a flow rate of the oxygen gas is between about 50 standard cubic centimeter per minute (sccm) and about 5000 sccm, and a ratio between a flow rate of the oxygen gas and a total flow rate of the gas source is between about 1% and about 20%.

In an embodiment, a method includes forming a fin; forming a first oxide layer over a top surface and over sidewalls of the fin, wherein the first oxide layer is non-conformal, wherein the first oxide layer over the top surface of the fin has a first thickness, and the first oxide layer along the sidewalls of the fin has a second thickness, wherein the first thickness is larger than the second thickness; and forming a gate electrode over the fin and over the first oxide layer. In an embodiment, the method further includes, after forming the first oxide layer and before forming the gate electrode, forming a second oxide layer over the first oxide layer, the second oxide layer being conformal. In an embodiment, the method further includes, before forming the first oxide layer, forming a second oxide layer over the fin, the second oxide layer being conformal, the second oxide layer being between the fin and the first oxide layer. In an embodiment, forming the first oxide layer includes performing an anisotropic plasma-enhanced atomic layer deposition (ALD) process. In an embodiment, forming the first oxide layer includes performing an anisotropic plasma treatment process.

In an embodiment, a semiconductor device includes a first fin field-effect transistor (FinFET) device. The first FinFET device includes a first fin protruding over a substrate; a first oxide layer disposed over a top surface of the first fin and along sidewalls of the first fin, where the first oxide layer is non-conformal, where the first oxide layer is thicker over the top surface of the first fin than along the sidewalls of the first fin; and a first gate electrode over the first fin and over the first oxide layer. In an embodiment, an average thickness of the first oxide layer along the sidewalls of the first fin is less than 80% of a thickness of the first oxide layer over the top surface of the first fin. In an embodiment, the semiconductor device further includes a second FinFET device, where the second FinFET device includes a second fin protruding over the substrate; a second oxide layer disposed over a top surface of the second fin and along sidewalls of the second fin, where the second oxide layer is conformal; and a second gate electrode over the second fin and over the second oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin protruding over a substrate;
   forming isolation regions on opposing sides of the fin, wherein the fin protrudes above an upper surface of the isolation regions distal from the substrate;
   forming a conformal oxide layer over an upper surface and along sidewalls of the fin;
   forming a non-conformal oxide layer over the upper surface and along the sidewalls of the fin, wherein forming the non-conformal oxide layer comprises performing an anisotropic oxide deposition process, wherein the non-conformal oxide layer is formed by the anisotropic oxide deposition process to extend continuously from a first sidewall of the fin, along the upper surface of the fin, to a second opposing sidewall of the fin, wherein the non-conformal oxide layer extends continuously from the upper surface of the fin to the upper surface of the isolation regions; and
   forming a gate electrode over the fin, wherein the conformal oxide layer and the non-conformal oxide layer are between the fin and the gate electrode.

2. The method of claim 1, wherein the anisotropic oxide deposition process is a plasma process performed in a plurality of cycles, wherein each of the plurality of cycles is performed by:
   supplying, between a first time instant and a second time instant, a silicon precursor to a process chamber for the anisotropic oxide deposition process;
   supplying a gas source comprising an oxygen gas to the process chamber between the first time instant and a third time instant, wherein the second time instant is between the first time instant and the third time instant; and
   activating, between a fourth time instant and a fifth time instant, the oxygen gas into a plasma by turning on a radio frequency (RF) power source for the plasma process, wherein the fourth time instant and the fifth time instant are between the second time instant and the third time instant.

3. The method of claim 2, wherein the RF power source is turned on continuously between the fourth time instant and the fifth time instant.

4. The method of claim 3, wherein a power of the RF power source is between about 10 W and about 1500 W, wherein a duration between the fourth time instant and the fifth time instant is between about 0.05 second and about 180 seconds, wherein a duration between the first time instant and the fourth time instant is between about 0.2 second and 50 seconds.

5. The method of claim 2, wherein the RF power source is turned on and off repeatedly between the fourth time instant and the fifth time instant.

6. The method of claim 5, wherein a total duration during which the RF power source is turned on between the fourth time instant and the fifth time instant is between about 0.05 seconds to about 180 seconds.

7. The method of claim 6, wherein between the fourth time instant and the fifth time instant, a gap between adjacent time periods when the RF power source is turned on is between about 0.1 second and about 5 seconds.

8. The method of claim 1, wherein a first portion of the conformal oxide layer along the sidewalls of the fin is formed to physically contact a second portion of the non-conformal oxide layer along the sidewalls of the fin.

9. The method of claim 1, wherein the conformal oxide layer is formed over the upper surface and along the sidewalls of the fin before the non-conformal oxide layer is formed.

10. The method of claim 1, wherein the non-conformal oxide layer is formed over the upper surface and along the sidewalls of the fin before the conformal oxide layer is formed.

11. A method comprising:
    forming a fin protruding over a substrate;
    forming a conformal oxide layer over an upper surface and along sidewalls of the fin;
    forming a non-conformal oxide layer over the upper surface and along the sidewalls of the fin by performing an anisotropic plasma treatment, wherein the anisotropic plasma treatment converts a first exterior portion of the fin along the upper surface of the fin and a second exterior portion of the fin along the sidewalls of the fin into the non-conformal oxide layer, wherein the first exterior portion is thicker than the second exterior portion; and
    forming a gate electrode over the fin, wherein the conformal oxide layer and the non-conformal oxide layer are between the fin and the gate electrode.

12. The method of claim 11, wherein a first portion of the conformal oxide layer along the sidewalls of the fin physically contacts a second portion of the non-conformal oxide layer along the sidewalls of the fin.

13. The method of claim 12, wherein the second portion of the non-conformal oxide layer is converted from the second exterior portion of the fin by the anisotropic plasma treatment.

14. The method of claim 11, wherein performing the anisotropic plasma treatment comprises:
    supplying a gas source comprising an oxygen gas to a process chamber for the anisotropic plasma treatment;
    activating the oxygen gas into a plasma by turning on a radio frequency (RF) power source for a first period of time while the gas source is supplied to the process chamber; and
    turning off the RF power source after the first period of time elapses.

15. The method of claim 14, wherein performing the anisotropic plasma treatment further comprises:
    after turning off the RF power source, continuing supplying the gas source to the process chamber for a second period of time; and
    stop supplying the gas source after the second period of time elapses.

16. The method of claim 11, wherein forming the conformal oxide layer is performed before forming the non-conformal oxide layer.

17. A method comprising:
    forming a fin protruding above a substrate;
    forming a non-conformal gate dielectric layer over a top surface of the fin and along sidewalls of the fin, wherein forming the non-conformal gate dielectric layer comprises performing an anisotropic plasma-enhanced atomic layer deposition (PEALD) process, wherein the anisotropic PEALD process is performed using a precursor comprising silicon and using a gas source comprising an oxygen gas, wherein the non-conformal gate dielectric layer has a first thickness over the top surface of the fin and has a second thickness along the sidewalls of the fin, the first thickness being different from the second thickness; and
    forming a gate electrode over the fin and over the non-conformal gate dielectric layer.

18. The method of claim 17, wherein the first thickness is larger than the second thickness.

19. The method of claim 17, further comprising forming a conformal gate dielectric layer over the top surface of the fin and along the sidewalls of the fin before forming the gate electrode.

20. The method of claim 19, wherein the conformal gate dielectric layer contacts and extends along the non-conformal gate dielectric layer over the top surface of the fin and along the sidewalls of the fin.

* * * * *